United States Patent
Mui et al.

[11] Patent Number: 6,037,265
[45] Date of Patent: Mar. 14, 2000

[54] ETCHANT GAS AND A METHOD FOR ETCHING TRANSISTOR GATES

[75] Inventors: David Mui, Santa Clara; Ajay Kumar, Sunnyvale; Jeffrey Chinn, Foster City, all of Calif.

[73] Assignee: Applied Materials, Inc., Santa Clara, Calif.

[21] Appl. No.: 09/022,772

[22] Filed: Feb. 12, 1998

[51] Int. Cl.[7] .................. H01L 21/3065; C09K 13/00
[52] U.S. Cl. .................. 438/719; 252/79.1; 438/720; 438/721; 438/700; 438/701
[58] Field of Search .................. 438/719, 720, 438/721; 252/79.1

[56] References Cited

U.S. PATENT DOCUMENTS

| | | | |
|---|---|---|---|
| 4,659,426 | 4/1987 | Fuller et al. | 438/719 |
| 4,855,017 | 8/1989 | Douglas | 438/695 |
| 5,556,521 | 9/1996 | Ghanbari | 204/192.32 |
| 5,560,804 | 10/1996 | Higuchi et al. | 439/719 |

*Primary Examiner*—Robert Kunemund
*Assistant Examiner*—Donald L. Champagne
*Attorney, Agent, or Firm*—Townsend and Townsend and Crew

[57] ABSTRACT

A method for producing a semiconductor device from a silicon substrate supporting a patterned hardmask layer, a tungsten silicide layer, a polysilicon layer, and a gate oxide layer. The method comprises etching the tungsten silicide layer and the polysilicon layer with an etchant gas comprising carbon monoxide (CO) and chlorine ($Cl_2$). The etchant gas may also include hydrogen bromide (HBr) or a nitrogen-containing gas (e.g., $N_2$).

91 Claims, 11 Drawing Sheets

ETCHANT GAS AND A METHOD FOR ETCHING TRANSISTOR GATES

BACKGROUND OF THE INVENTION

1. Field of the Invention

This invention relates to an etchant gas and to a method for etching transistor gates. More specifically, the present invention provides an improved etchant gas and a method for selectively etching with the improved etchant gas a tungsten silicide layer and a polysilicon layer over a gate oxide layer to form a semiconductor structure having straight wall, perpendicular profiles with low microloading and excellent profile control.

2. Description of the Prior Art

During state-of-the-art semiconductor processing of semiconductor devices, many devices are made in a single substrate. These devices are connected to each other by means of conductive lines. However, since these conductive lines can introduce unwanted electric signals in the semiconductor substrate during operation of the devices, the devices must be separated from each other by some means of isolation. The usual means of isolation is to etch trenches between the devices that can be filled with a dielectric material, such as silicon oxide.

Openings in silicon layers, such as tungsten silicide ($WSi_x$) and polysilicon, are also etched for various semiconductor processes. For example, trenches are formed in polysilicon layers that will be filled with silicon oxide. The sidewalls of the trenches must be as straight as possible so that no voids remain after filling the trench. The bottom of the trench must have a smooth line between the sidewall and the bottom. Stated alternatively, there should be no microtrenching between the sidewall and the bottom of the trench. Further, it is desirable to have a high etch rate consistent with the above criteria.

Various etchants are known for silicon, such as halogen and halogen-containing etchants. HBr is known to form deep straight-walled openings in silicon and polysilicon. However, the etch rate is low and HBr is corrosive to expensive equipment. Chlorine alone is unsatisfactory because the etch is isotropic. Oxygen can be added to chlorine for etching trenches, which provides a higher etch rate, but the sidewalls are not straight, resulting in a bowed profile. A mixture of helium and oxygen (e.g. 70% by vol. He and 30% by vol. $O_2$) has been used to improve the etch rate, but the mixture causes undesirable microtrenching in a gate oxide layer.

Therefore, what is needed and what has been invented is an improved etchant gas that is highly anisotropic, that has a high etch rate, and that provides trenches with straight walls. What is further needed and what has been invented is a method for etching conductive layers supported by a gate oxide ($SiO_2$) layer to obtain smooth sidewalls without any associated microtrenching of the gate oxide layer.

SUMMARY OF THE INVENTION

The present invention accomplishes the desired objects by broadly providing a method for etching at least one conductive layer on a substrate comprising the steps of:
(a) providing a substrate supporting at least one conductive layer; and
(b) etching the conductive layer with an etchant gas comprising chlorine ($Cl_2$) and carbon monoxide (CO) to produce the substrate of step (a) supporting an etched conductive layer.

The method additionally comprises disposing, prior to the etching step (b), the substrate of step (a) in a high density plasma chamber including a coil inductor and a wafer pedestal; and performing the etching step (b) in the high density plasma chamber under the following process conditions:

| Process | Parameters |
| --- | --- |
| Etchant Gas Flow | 10 to 400 sccm |
| Pressure, mTorr | 0.5 to 50 milliTorr |
| RF Power (watts) of Coil Inductor | 100 to 3000 watts |
| RF Power (watts) of Wafer Pedestal | 50 to 1500 watts |
| Temperature (° C.) of Substrate | 20 to 100° C. |
| Conductive Layer Etch Rate (Å/min) | 200 to 4000 Å/min |
| RF Frequency of Coil Inductor | 100 K to 200 MHz |
| RF Frequency of Wafer Pedestal | 100 K to 200 MHz |

The present invention also accomplishes its desired objects by broadly providing a method for etching a polysilicon layer supporting a tungsten-silicide layer comprising the steps of:
(a) providing a substrate supporting a polysilicon layer having a tungsten-silicide layer disposed thereon;
(b) providing an etchant gas comprising carbon monoxide (CO), chlorine ($Cl_2$), and nitrogen ($N_2$);
(c) etching the tungsten-silicide layer of step (a) with the etchant gas of step (b) to remove at least a portion of the tungsten-silicide layer to expose at least part of the polysilicon layer;
(d) providing an etchant gas comprising carbon monoxide (CO), chlorine ($Cl_2$), and hydrogen bromide (HBr); and
(e) etching the exposed part of the polysilicon layer with the etchant gas of step (d).

The immediate foregoing method preferably additionally comprises disposing, prior to the etching step (e), the substrate after step (c) in a high density plasma chamber including a coil inductor and a wafer pedestal; and performing the etching step (e) in the high density plasma chamber under the following process conditions:

| Process | Parameters |
| --- | --- |
| Carbon Monoxide (CO) | 1 to 90% by vol. |
| Chlorine ($Cl_2$) | 10 to 99% by vol. |
| Hydrogen Bromide (HBr) | 10 to 99% by vol. |
| RF Power (watts) of Coil Inductor | 100 to 3000 watts |
| RF Frequency of Wafer Pedestal | 50 to 1500 watts |
| Temperature (° C.) of Substrate | 20 to 100° C. |
| Polysilicon Etch Rate (Å/min) | 200 to 4000 Å/min |
| RF Frequency of Coil Inductor | 100 K to 200 MHz |
| RF Frequency of Wafer Pedestal | 100 K to 200 MHz |

The present invention further also accomplishes its desired objects by further broadly providing a method for producing a semiconductor device comprising the steps of:
(a) forming a patterned hardmask layer, a tungsten silicide layer, a polysilicon layer, and a gate oxide layer on a silicon substrate;
(b) etching a portion of the tungsten silicide layer with an etchant gas comprising carbon monoxide (CO), chlorine ($Cl_2$), and nitrogen ($N_2$) to remove the portion of tungsten silicide layer from the polysilicon layer to produce the silicon substrate supporting the patterned hardmask layer, a residual tungsten silicide layer, the polysilicon layer, and the gate oxide layer; and (c) etching the polysilicon layer with an etchant gas comprising carbon monoxide (CO), chlorine (Cl$_2$), and hydrogen bromide (HBr) to produce a semiconductor device.

The foregoing method may additionally comprise disposing, prior to the etching step (b), the substrate of step (a) in a high density plasma chamber including a coil inductor and a wafer pedestal; and performing the etching step (b) in the high density plasma chamber under the following process conditions:

| Process | Parameters |
| --- | --- |
| Carbon Monoxide (CO) | 1 to 90% by vol. |
| Chlorine (Cl$_2$) | 10 to 99% by vol. |
| Nitrogen (N$_2$) | 10 to 99% by vol. |
| RF Power (watts) of Coil Inductor | 100 to 3000 watts |
| RF Frequency of Wafer Pedestal | 50 to 1500 watts |
| Temperature (° C.) of Substrate | 20 to 100° C. |
| Tungsten-Silicide Etch Rate (Å/min) | 1500 to 3000 (Å/min) |
| RF Frequency of Coil Inductor | 100 K to 200 MHz |
| RF Frequency of Wafer Pedestal | 100 K to 200 MHz |

The etchant gas of the present invention broadly comprises carbon monoxide (CO) and chlorine (Cl$_2$). Preferably, the etchant gas for etching polysilicon comprises carbon monoxide (CO), chlorine (Cl$_2$), and hydrogen bromide (HBr). More preferably, the etchant gas for etching polysilicon consists of, or consists essentially of, carbon monoxide (CO), chlorine (Cl$_2$), and hydrogen bromide (HBr). In a preferred embodiment of the present invention, the etchant gas for etching polysilicon comprises, or consists of or consists essentially of, from about 1% by vol. to about 90% by vol. carbon monoxide (CO) and from about 10% by vol. to about 99% by vol. chlorine (Cl$_2$); more preferably from about 1% by vol. to about 90% by vol. carbon monoxide (CO), from about 10% by vol. to about 99% by vol. chlorine (Cl$_2$), and from about 10% by vol. to about 99% by vol. hydrogen bromide (HBr). Preferably, the etchant gas for etching tungsten silicide comprises carbon monoxide (CO), chlorine (Cl$_2$) and nitrogen (N$_2$). More preferably, the etchant gas for etching tungsten silicide consists of, or consists essentially of, carbon monoxide (CO), chlorine (Cl$_2$), and nitrogen (N$_2$). In a preferred embodiment of the present invention, the etchant gas for etching tungsten silicide comprises, or consists of, or consists essentially of, from about 10% by vol. to about 99% by vol. chlorine (Cl$_2$) and from about 1% by vol. to about 90% by vol. carbon monoxide (CO) and from about 10% by vol. to about 99% by vol. nitrogen (N$_2$); preferably from about 20% by volume to about 80% by volume of chlorine (Cl$_2$) and from about 20% by volume to about 80% by volume of the carbon monoxide gas and from about 20% by volume to about 80% by volume of nitrogen (N$_2$); and more preferably from about 40% by volume to about 80% by volume of chlorine (Cl$_2$) and from about 20% by volume to about 30% by volume of the carbon monoxide gas and from about 20% by volume to about 30% by volume of nitrogen (N$_2$).

The present invention yet also further accomplishes its desired objects by broadly providing a semiconductor device produced in accordance with the method(s) of the present invention. The etched conductive layer(s) (i.e., etched tungsten silicide layer and etched polysilicon layer) have a profile equal to or greater than about 85°, preferably equal to or greater than about 87° more preferably equal to or greater than about 88.5°.

It is, therefore, an object of the present invention to provide a method for etching at least one conductive layer on a substrate.

It is another object of the present invention to provide a method for producing a semiconductor device.

It is yet another object of the present invention to provide a semiconductor device produced in accordance with the method(s) of the present invention.

These, together with the various ancillary objects and features which will become apparent to those skilled in the art as the following description proceeds, are attained by these novel method(s) and semiconductor device(s), a preferred embodiment thereof shown with reference to the accompanying drawings, by way of example only, wherein:

DESCRIPTION OF THE PREFERRED EMBODIMENT

Figure 1:
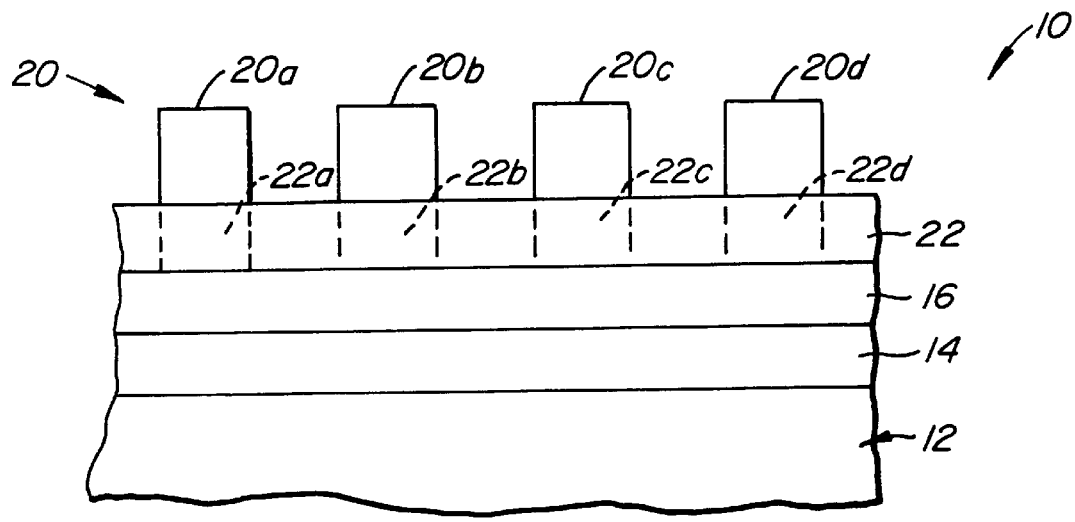
FIG. 1 is a side sectional view of a semiconductor wafer having a semiconductor substrate, a gate oxide layer disposed on the semiconductor substrate, a polysilicon layer disposed on the gate oxide layer, a tungsten silicide layer disposed on the polysilicon layer, and a resist disposed on the tungsten silicide layer.
Figure 2:
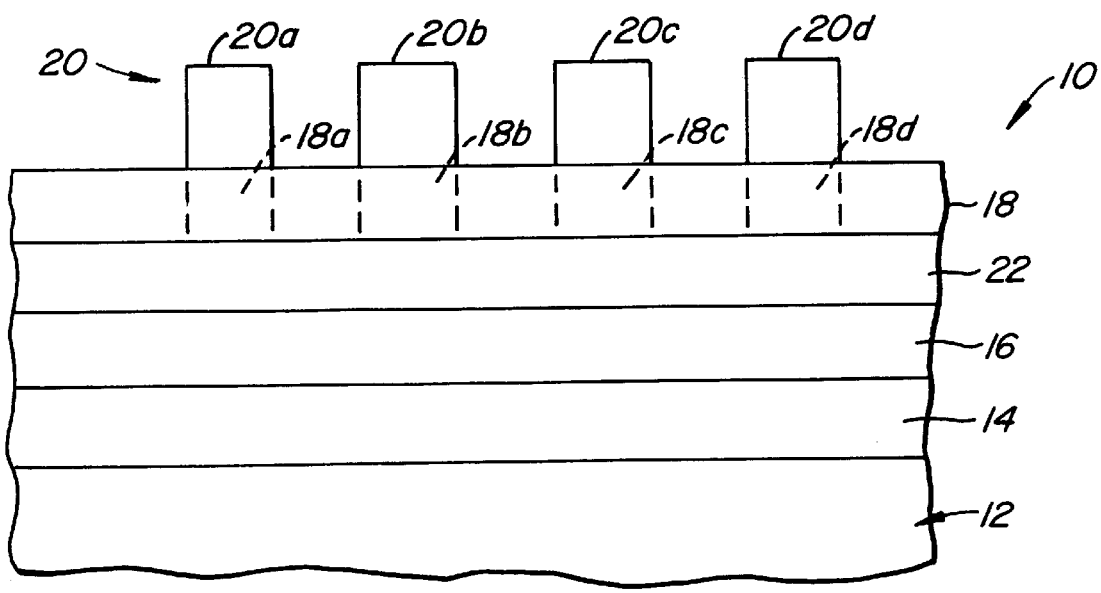
FIG. 2 is a side sectional view of the semiconductor wafer of FIG. 1 additionally including a mask layer disposed on the tungsten silicide layer between the resist and the tungsten silicide layer.

Referring in detail now to the drawings wherein similar parts of the present invention are identified by like reference numerals, there is see in FIG. 1 a wafer, generally illustrated as 10, having a semiconductor substrate (e.g., a silicon substrate), generally illustrated as 12. A gate oxide layer (e.g., a $SiO_2$ layer) 14 is disposed over the semiconductor substrate 12 and a polysilicon layer 16 is disposed over the gate oxide layer 14. The polysilicon layer 16 supports a tungsten silicide layer ($WSi_x$) 22. In one embodiment of the present invention and as best shown in FIG. 1, the tungsten silicide layer 22 directly supports a resist 20 (i.e., a photoresist or photomask) which is patterned for being selectively positioned on the tungsten silicide layer 22. In another embodiment of the present invention, the tungsten silicide layer 22 supports a mask layer 18 which in turn supports the resist 20 as best shown in FIG. 2.

The gate oxide layer 14 may be any suitable dielectric layer which is capable of functioning as an insulator. The gate oxide layer 14 may be of any suitable thickness, preferably a very thin thickness in order not to lower the speed of any semiconductor device possessing the gate oxide layer 14. Preferably, the gate oxide layer 14 comprises silicon dioxide ($SiO_2$) and/or silicon nitride ($Si_3N_4$), or any other suitable dielectric material; and possesses a thickness ranging from about 20 Ångstroms to about 200 Ångstroms, more preferably from about 20 Ångstroms to about 120 Ångstroms, most preferably from about 20 Ångstroms to about 60 Ångstroms. For conventional etching methods with conventional etchant gases, if the gate oxide layer 14 is too thin, there is a danger of etching or microtrenching through the gate oxide layer 14 to the underlying semiconductor substrate 12, causing a short in any semiconductor device employing the etched semiconductor structure. With the etchant gas(es) of the present invention, however, a very thin (e.g., (e.g., 20 Å to 60 Å) gate oxide layer 14 may be employed because the etching methods of the present inventions produces semiconductor devices where the gate oxide layer 14 has essentially no microtrenches. The etchant gas(es) of the present invention also maintain a high selectivity between the polysilicon layer 16 and the gate oxide layer 14 to avoid microtrenching or etching through the gate oxide layer 14.The gate oxide layer 14 is preferably disposed on the semiconductor substrate 12 by the RF magnetron sputtering method.

The polysilicon layer 16 is used as an electrode material because it is inert to oxidation which tends to occur in the subsequent high temperature processes of depositing the high dielectric constant ferroelectric materials. The polysilicon layer 16 is also used as the electrode material because polysilicon is a good electric conductor. The thickness of the polysilicon layer 16 would depend upon the end use of the semiconductor which is to contain the polysilicon layer 16. Typically, the thickness of the polysilicon layer 16 ranges from about 300 Ångstroms to about 8000 Ångstroms, more preferably from about 500 Ångstroms to about 6000 Ångstroms, most preferably from about 1000 Ångstroms to about 3000 Ångstroms. The polysilicon layer 16 is preferably disposed on the gate oxide layer 14 by the RF magnetron sputtering method.

The tungsten silicide layer 22 is used as an electrode material because it is also inert to oxidation which tends to occur in the subsequent high temperature processes of depositing the high dielectric constant ferroelectric materials. Like the polysilicon layer 16, the tungsten silicide layer 22 is also used as the electrode material because tungsten silicide is a good electric conductor. As was indicated for the polysilicon layer 16, the thickness of the tungsten silicide layer 16 would depend upon the end use of the semiconductor which is to contain the tungsten silicide layer 16. Typically, the thickness of the tungsten silicide layer 22 ranges from about 400 Ångstroms to about 4000 Ångstroms, more preferably from about 500 Ångstroms to about 2,400 Ångstroms, most preferably from about 800 Ångstroms to about 2000 Ångstroms. The tungsten silicide layer 22 is preferably disposed on the polysilicon layer 16 by the RF magnetron sputtering method.

The mask layer 18 (i.e., a hardmask silicon oxide layer) may be any suitable mask layer that is capable of being etched and patterned in accordance with the procedure described hereinafter such that all traces of the mask layer 18 are essentially removed from the surface of the tungsten silicide layer 22 except those portions (identified as "18a", "18b", "18c and "18d" below) of the mask layer 18 remaining under the resist 20, more specifically remaining under resist members (identified as "20a", "20b", "20c" and "20d" below). The mask layer 18 may also be of any suitable thickness. Preferably, the mask layer 18 comprises silicon dioxide ($SiO_2$) and/or silicon nitride ($Si_3N_4$) or any other suitable material. A preferred thickness for the mask layer 18 ranges from about 500 Ångstroms to about 8000 Ångstroms, more preferably from about 600 Ångstroms to about 6000 Ångstroms, most preferably from about 1000 Ångstroms to about 2000 Ångstroms. The mask layer 18 is preferably disposed on the tungsten silicide layer 22 by chemical vapor deposition.

The resist 20 (i.e., the photoresist 20) may be any suitable layer of material(s) that is capable of being patterned for protecting any underlying material (e.g., the mask layer 18) from being etched during the etching process of the present invention. The resist 20 is patterned to include resist members 20a, 20b, 20c and 20d. Suitable materials for the resist 20 include resist systems consisting of novolac resin and a photoactive dissolution inhibitor (all based on Suiss's discovery). Other suitable materials for the resist 20 are listed in an article from the July 1996 edition of Solid State Technology entitled "Deep-UV Resists: Evolution and Status" by Hiroshi Ito. The resist 20 may have any suitable thickness; preferably, the thickness of the resist 20 ranges from about 0.3 μm to about 1.40 μm, more preferably from about 0.4 μm to about 0.8 μm, most preferably about 0.6 μm.

The resist 20 is preferably disposed on the mask layer 18 by the spin coating method.

Figure 3:
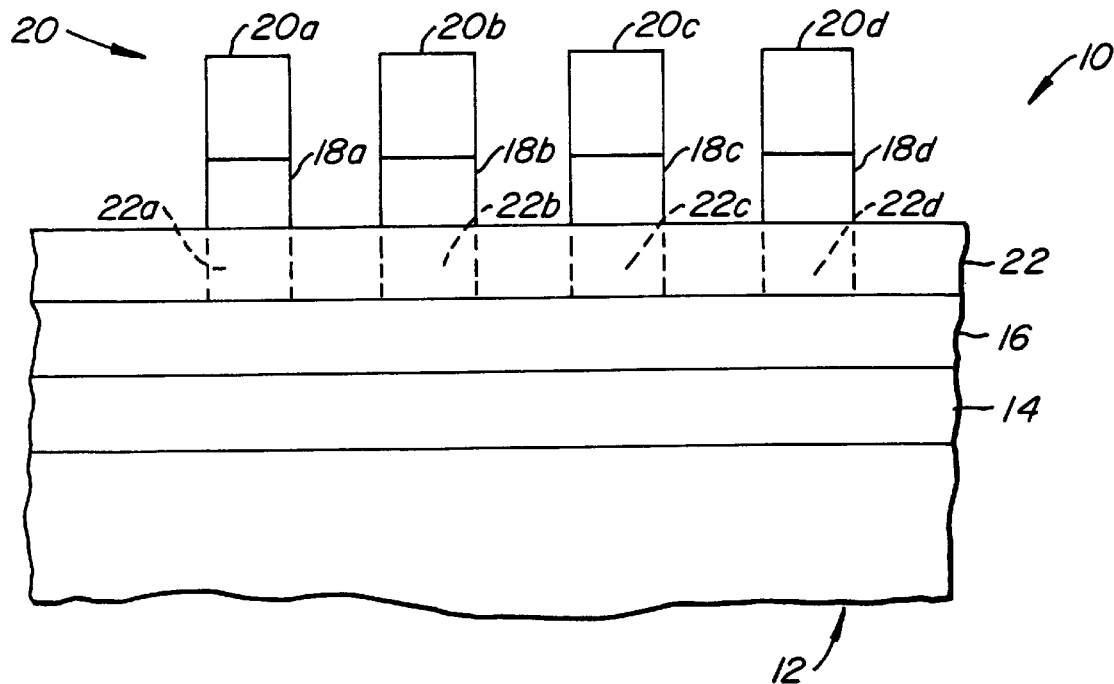
FIG. 3 is a side sectional view of the semiconductor of FIG. 2 after etching and removing a portion of the mask layer from the surface of the tungsten silicide layer to expose the tungsten silicide layer.
Figure 9:
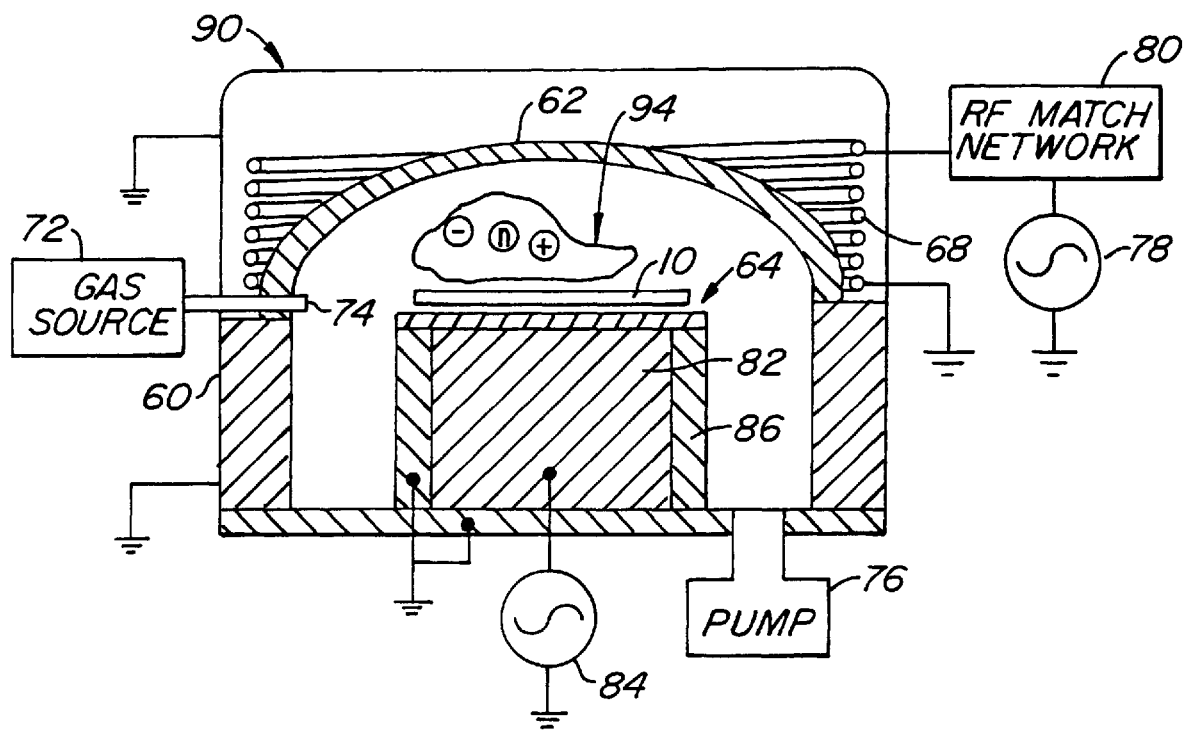
FIG. 9 is a simplified cut-away view of an inductively coupled RF plasma reactor which may be employed in etching the tungsten silicide layers and the polysilicon layers.
Figure 10:
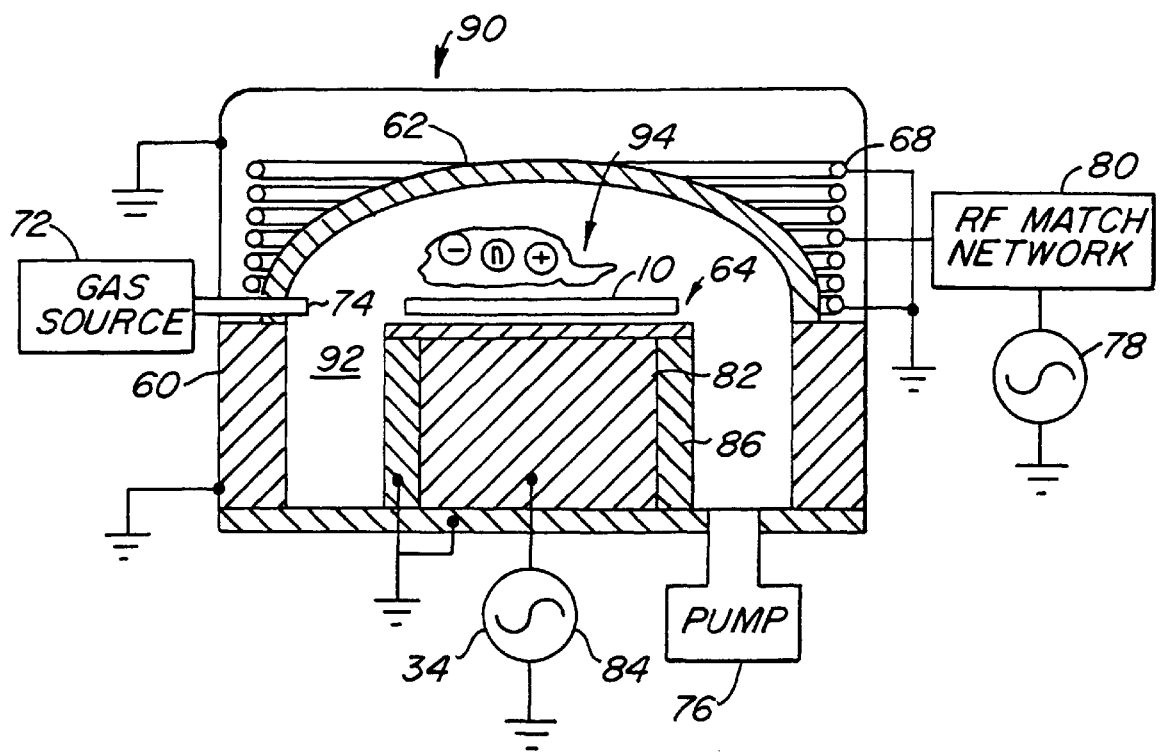
FIG. 10 is a simplified cut-away view of another inductively coupled RF plasma reactor which may be employed in etching the tungsten silicide layers and the polysilicon layers.

In order to form or produce a semiconductor device from the multilayered structure of FIG. 1 or FIG. 2, the multilayered structure is initially placed in a suitable plasma processing apparatus to break through and remove or etch away selective parts of the mask layer 18 from the surface of the tungsten silicide layer 22, except the mask layers 18a, 18c and 18d that are below the resist 20, more specifically below the resist members 20a, 20b, 20c and 20d as best shown in FIG. 3. A suitable prior art plasma processing apparatus for breaking through the mask layer 18 is shown in FIGS. 9 and 10 and is sold by Applied Material Inc. under the trademark Poly-Si Etch DPS Centura™." The plasma processing apparatus of FIGS. 9 and 10 is described hereinafter.

A plasma is used to break through (i.e. to clean and etch away) the mask layer 18, except that those mask layers 18a, 18b, 18c and 18d, respectively, below the resist members 20a, 20b, 20c and 20d, as best shown FIG. 3. The plasma may employ any suitable etchant gas. For example, if the mask layer 18 contains silicon oxide, suitable etchant gas (es) may be selected from the group consisting of fluorine-containing gases (e.g. $CHF_3$, $SF_6$, $C_2F_6$, $NF_3$, $CF_4$, etc.), bromine-containing gases (e.g., HBr, etc.), chlorine-containing gases (e.g., $Cl_2$, $CHCl_3$, etc.), rare gases (e.g., argon, etc.), and mixtures thereof. The etchant gas flow typically ranges from about 10 sccm to about 150 sccm. Preferably, the etchant does not include an oxidant, such as oxygen, since the purpose of this step is to remove the mask layer 18 (except mask layers 18a, 18b, 18c and 18d, which are protected by resist members 20a, 20b, 20c and 20d) and not to remove the resist 20. Preferably, the etchant gas comprises from about 20% by volume to about 100% by volume $CF_4$ and from about 0% by volume to about 80% by volume argon. The reactor conditions for a suitable plasma processing apparatus (such as the plasma processing apparatus of FIGS. 9 and 10) in removing the mask layer 18 (except mask layers 18a, 18b, 18c and 18d) may be any suitable reactor conditions well known to those skilled in the art. The selectivity of mask layer 18/resist 20 is better than 3:1, depending on the materials employed for the mask layer 18 and the resist 20.

After selective parts of the mask layer 18 have been etched away (see FIG. 3) from the surface of the tungsten silicide layer 22 to expose the latter and such that the only remnants of the mask layer 18 are the mask layers 18a, 18b, 18c and 18d situated immediately below the resist members 20a, 20b, 20c, and 20d, respectively, the mask layer 18 has now been patterned in accordance with the pattern of resist 20. For the embodiment of the invention depicted in FIG. 1, the resist 20 would not be removed since the pattern of the resist members 20a, 20b, 20c and 20d are needed for etching the tungsten silicide layer 22 and the polysilicon layer 16. For the embodiment of the invention illustrated in FIG. 2, the resist members 20a, 20b, 20c and 20d may be removed at any suitable time, such as before or after the etching of the tungsten silicide layer 22.

The resist members 20a, 20b, 20c and 20d in FIG. 3 may be removed in any suitable manner such as by using oxygen plasma ashing which is well known to those skilled in the art. The resist members 20a, 20b, 20c and 20d may be respectively stripped from the mask layers 18a, 18b, 18c and 18d with any suitable plasma processing apparatus, such as the plasma processing apparatus shown in FIGS. 9 and 10 (and described hereinafter) employing a plasma containing an etchant gas comprising oxygen.

Figure 4:
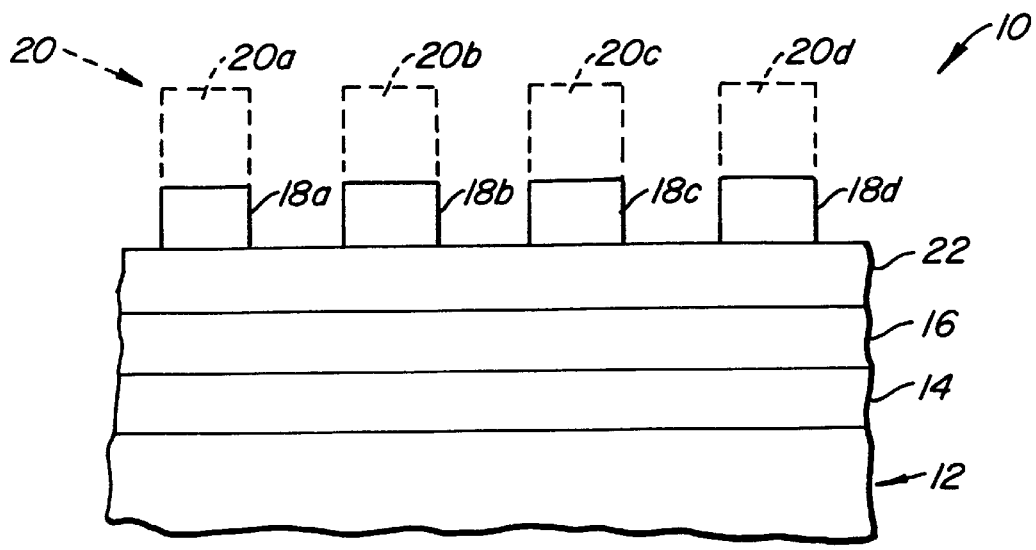
FIG. 4 is a side sectional view of the semiconductor wafer of FIG. 3 after the resist members have been removed from a portion of the mask layer (i.e., the mask members) with the removed resist members being represented as broken lines.

After the tungsten silicide layer 22 has been exposed as represented in FIGS. 1 and 4, it, along with the polysilicon layer 16, are etched to develop a submicron pattern with a profile. The tungsten silicide layer 22 and the polysilicon layer 16 may be etched in any suitable plasma processing apparatus. A suitable plasma processing apparatus for etching the tungsten silicide layer 22 and the polysilicon layer 16 employs a plasma of an etchant gas, which is capable of producing good profiles (e.g. profiles equal to or greater than about 85 degrees, preferably equal to or greater than about 87 degrees, more preferably equal to or greater than about 88.5 degrees). The etchant gas broadly comprises a halogen (e.g., fluorine, chlorine, bromine, iodine, and astatine) and a carbon monoxide. Preferably, the etchant gas comprises or consists of or consists essentially of a halogen gas, and carbon monoxide. The halogen gas is preferably chlorine. The etchant gas more specifically preferably comprises from about 10% by volume to about 99% by volume of the halogen gas (i.e., chlorine) and from about 1% by volume to about 90% by volume of the carbon monoxide gas; more preferably from about 30% by volume to about 90% by volume of the halogen gas (i.e., chlorine) and from about 10% by volume to about 70% by volume of the carbon monoxide gas; most preferably from about 70% by volume to about 80% by volume of the halogen gas (i.e., chlorine) and from about 20% by volume to about 30% by volume of the carbon monoxide gas.

In a more preferred embodiment of the invention, the etchant gas for etching the tungsten silicide layer 22 comprises, preferably consists of or consists essentially of, the halogen (i.e., chlorine), the carbon monoxide gas, and a nitrogen-containing gas (e.g. nitrogen, $N_2$). The etchant gas more specifically comprises, or consists of or consists essentially of, from about 10% by volume to about 99% by volume of the halogen gas (i.e., chlorine) and from about 1% by volume to about 90% by volume of the carbon monoxide gas and from about 10% by volume to about 99% by volume of nitrogen-containing gas (i.e., nitrogen, $N_2$); preferably from about 20% by volume to about 80% by volume of the halogen gas (i.e., chlorine) and from about 20% by volume to about 80% by volume of the carbon monoxide gas and from about 20% by volume to about 80% by volume of nitrogen-containing gas (e.g., nitrogen, $N_2$); and more preferably from about 40% by volume to about 80% by volume of the halogen gas (i.e., chlorine) and from about 20% by volume to about 30% by volume of the carbon monoxide gas and from about 20% by volume to about 30% by volume of nitrogen-containing gas (e.g., nitrogen, $N_2$). The etchant gas flow rate ranges from about 50 sccm to about 500 sccm. The nitrogen-containing gas is preferably nitrogen, $N_2$.

In another more preferred embodiment of the invention, the etchant gas for etching the polysilicon layer 16 comprises, preferably consists of or consists essentially of, the halogen (i.e., chlorine), the carbon monoxide gas, and a gas selected from the group consisting of HBr, $BCl_3$ and mixtures thereof. The etchant gas more specifically comprises, or consists of or consists essentially of, from about 10% by volume to about 99% by volume of the halogen gas (i.e., chlorine) and from about 1% by volume to about 90% by volume of the carbon monoxide gas and from about 10% by volume to about 99% by volume of HBr and/or $BCl_3$; preferably from about 20% by volume to about 80% by volume of the halogen gas (i.e., chlorine) and from about 20% by volume to about 80% by volume of the carbon monoxide gas and from about 20% by volume to about 80% by volume of HBr and/or $BCl_3$; and more preferably from about 40% by volume to about 80% by volume of the halogen gas (i.e., chlorine) and from about 20% by volume to about 30% by volume of the carbon monoxide gas and from about 40% by volume to about 80% by volume of HBr and/or $BCl_3$. The etchant gas flow rate ranges from about 50 sccm to about 500 sccm. HBr and/or $BCl_3$ is or are for removal of polysilicon residue during etching of the polysilicon layer 16.

In another preferred embodiment of the present invention, the etchant gas comprises, preferably consists or consists essentially of, the halogen (i.e. chlorine), carbon monoxide, and oxygen. The etchant gas more specifically comprises, or consists of or consists essentially of, from about 10% by volume to about 90% by volume of the halogen gas (i.e., chlorine) and from about 5% by volume to about 80% by volume of carbon monoxide gas and from about 5% by volume to about 10% by volume of $He:O_2$ (i.e. 70% by vol. He and 30% by vol. $O_2$); preferably from about 30% by volume to about 80% by volume of the halogen gas (i.e., chlorine) and from about 10% by volume to about 60% by volume of carbon monoxide gas, and from about 6% by volume to about 9% by volume $He:O_2$; and more preferably from about 60% by volume to about 70% by volume of the halogen gas (i.e., chlorine) and from about 10% by volume to about 30% by volume of the carbon monoxide gas and from about 7% by volume to about 9% by volume of $He:O_2$.

Figure 5:
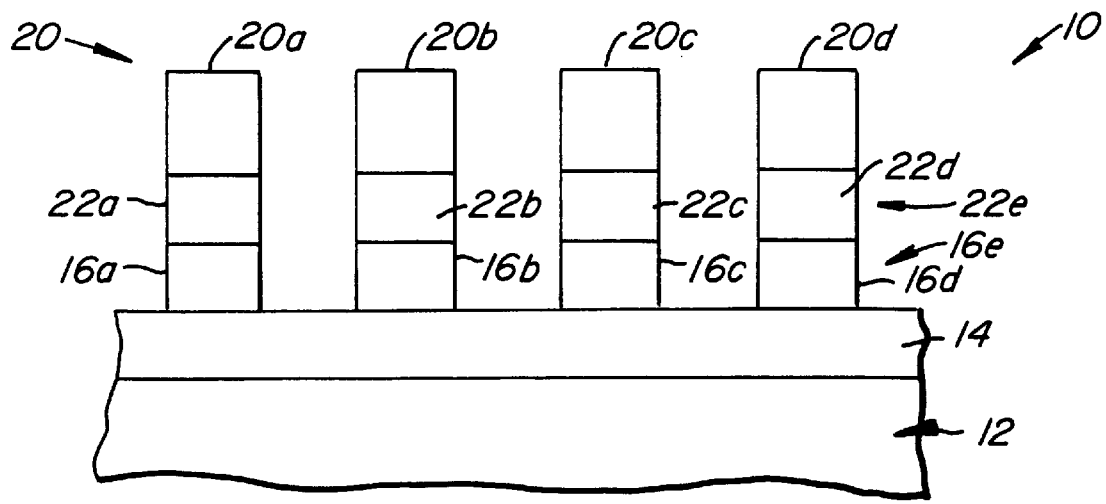
FIG. 5 is a side sectional view of the semiconductor wafer of FIG. 1 after the tungsten silicide layer and the polysilicon layer have been etched down to the gate oxide layer.
Figure 6:
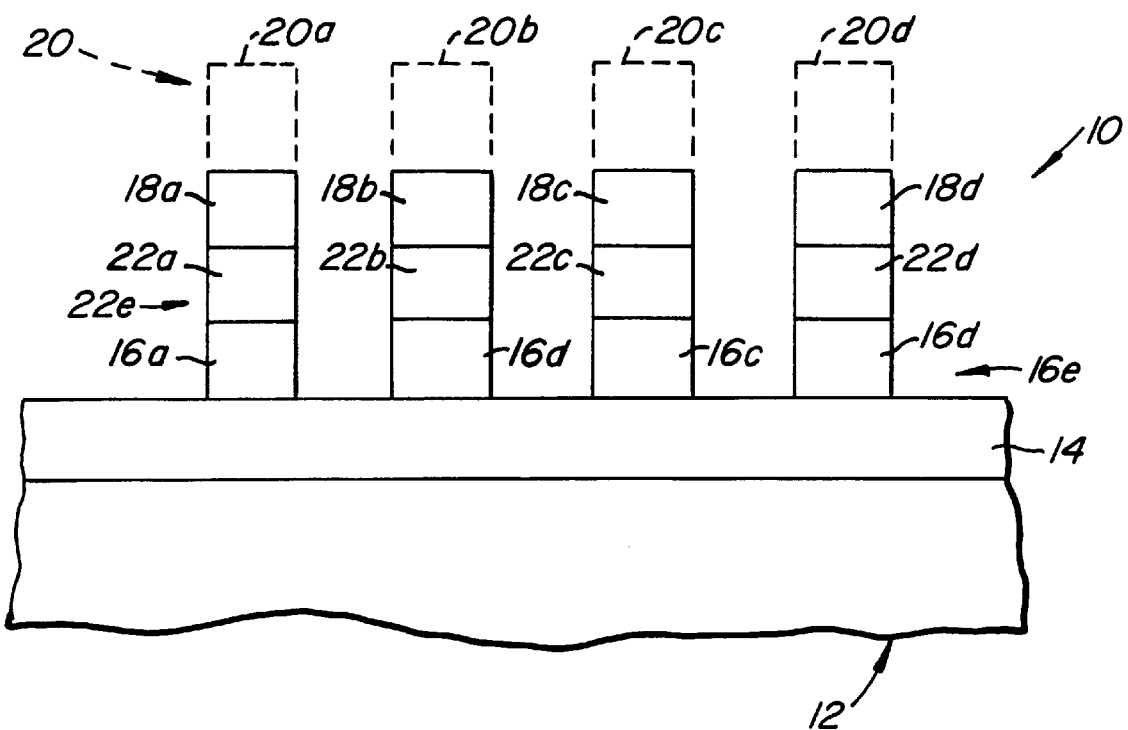
FIG. 6 is a side sectional view of the semiconductor wafer of FIG. 4 after the tungsten silicide layer and the polysilicon layer have been etched down to the gate oxide layer.

As previously indicated, a more preferred etchant gas for etching the tungsten silicide layer 22 and the polysilicon layer 16 comprises chlorine and carbon monoxide; more specifically, the etchant gas for etching the tungsten silicide layer 22 comprises chlorine, carbon monoxide, and nitrogen; and the etchant gas for etching the polysilicon layer 16 comprises chlorine, carbon monoxide and HBr and/or $BCl_3$. If the etchant gas for etching the tungsten silicide layer 22 comprises chlorine, carbon monoxide, and nitrogen (i.e., from about 10% by volume to about 99% by volume chlorine and from about 1% by volume to about 90% by volume carbon monoxide and from about 10% by volume to about 99% by volume nitrogen), and if the etchant gas for etching the polysilicon layer 16 comprises chlorine, carbon monoxide, and HBr (i.e., from about 10% by volume to about 99% by volume chlorine and from about 1% by volume to about 90% by volume carbon monoxide and from about 10% by volume to about 99% by volume HBr), the plasma processing apparatus for etching etches the tungsten silicide layer 22 and the polysilicon layer 16 in a high density plasma of the etchant gas at a high etch rate (i.e. an etch rate higher than 1000 Å/min) and produces an etched tungsten silicide layer, generally illustrated as 22e, and an etched polysilicon layer, generally illustrated as 16e (as best shown in FIGS. 5 and 6). The etched tungsten silicide layer 22e comprises etched tungsten silicide members 22a, 22b, 22c and 22d. The etched polysilicon layer 16e includes etched polysilicon members 16a, 16b, 16c and 16d. The etched tungsten silicide layer 22e and the etched polysilicon layer 16e have an excellent profile; that is, a profile where the angle of the sidewalls with respect to a horizontal plane is equal to or greater than about 85 degrees, preferably equal to or greater than about 87°, and more preferably equal to or greater than about 88.5°. The respective imposed or stacked members (i.e. members 22a/16a and 22b/16b, etc.) are separated by a distance or space having a dimension equal to or less than about 0.3 $\mu$m. Each of the stacked members include a dimension having a value equal to or less than about 0.6 $\mu$m, preferably equal to or less than about 0.3 $\mu$m. More preferably, each of the stacked members have a width equal to or less than about 0.6 $\mu$m, and a height equal to or less than about 0.6 $\mu$m.

The high density plasma of the present invention may be defined as a plasma of the etchant gas of the present invention having an ion density greater than about $10^9/cm^3$, preferably greater than about $10^{11}/cm^3$. The source of the high density plasma may be any suitable high density source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The high density plasma for the present invention is more preferably produced or provided by inductively coupling a plasma in a decoupled plasma source etch chamber, such as that sold under the trademark DPST owned by Applied Materials, Inc. which decouples or separates the ion flux to the wafer 10 and the ion acceleration energy. The design of the etch chamber provides fully independent control of ion density of an enlarged process window. This is accomplished by producing plasma via an inductive source. While a cathode within the etch chamber is still biased with rf electric fields to determine the ion acceleration energy, a second rf source (i.e. an inductive source) determines the ion flux. This second rf source is not capacitive (i.e. it does not use electric fields like the cathode) since a large sheath voltage would be produced, interfering with the cathode bias and effectively coupling the ion energy and ion flux.

The inductive plasma source couples rf power through a dielectric window rather than an electrode. The power is coupled via rf magnetic fields (not electric fields) from rf current in a coil. These rf magnetic fields penetrate into the plasma and induce rf electric fields (therefore the term "inductive source") which ionize and sustain the plasma. The induced electric fields do not produce large sheath voltages like a capacitive electrode and therefore the inductive source predominantly influences ion flux. The cathode bias power plays little part in determining ion flux since most of the rf power (typically an order of magnitude less than the source power) is used in accelerating ions. The combination of an inductive plasma source and a capacitive wafer bias allows independent control of the ion flux and ion energy reaching the wafer 10 in the etch chamber, such as the DPS™ brand etch chamber.

DPS™ brand etch chambers for producing the high density plasma of the present invention for etching the tungsten silicide layer 22 and the polysilicon layer 16 to produce respectively the etched tungsten silicide members 22a, 22b, 22c and 22d and the polysilicon members 16a, 16b, 16c and 16d may be any of the DPS™ brand etch chambers of the inductively coupled plasma reactor disclosed in U.S. Pat. No. 5,753,044, entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIGS. 9 and 10 for two (2) embodiments of an inductively coupled plasma reactor from U.S. Pat. No. 5,753,044 there is seen an inductively coupled RF plasma reactor generally illustrated as 90, having a reactor chamber, generally illustrated as 92, wherein a high density plasma 94 of neutral (n) particles, positive (+) particles, and negative (−) particles are found. The reactor chamber 92 has a grounded conductive cylindrical sidewall 60 and a dielectric ceiling 62. The inductively coupled RF plasma reactor 90 further comprises a wafer pedestal 64 for supporting the (semiconductor) wafer 10 in the center of the chamber 92, a cylindrical inductor coil 68 surrounding an upper portion of the chamber 92 beginning near the plane of the top of the wafer 10 or wafer pedestal 64 and extending upwardly therefrom toward the top of the chamber 92, an etching gas source 72 and gas inlet 74 for furnishing an etching gas into the interior of the chamber 92, and a pump 76 for controlling the pressure in the chamber 92. The coil inductor 68 is energized by a plasma source power supply or RF generator 78 through a conventional active RF match network 80, the top winding of the coil inductor 68 being "hot" and the bottom winding being grounded. The wafer pedestal 64 includes an interior conductive portion 82 connected to the bias RF power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy, in accordance with well-known techniques. To produce high density plasma 94 as an inductively coupled plasma, the coil inductor 68 is adjacent to the chamber 92 and is connected to the RF source power supply or the RF generator 78. The coil inductor 68 provides the RF power which ignites and sustains the high ion density of the high density plasma 94. The geometry of the coil inductor 68 can in large part determine spatial distribution of the plasma ion density of the high density plasma 94 within the reactor chamber 92.

Uniformity of the plasma density spatial distribution of the high density plasma 94 across the wafer 10 is improved (relative to conical or hemispherical ceilings) by shaping the ceiling 62 in a multi-radius dome and individually determining or adjusting each one of the multiple radii of the ceiling 62. The multiple-radius dome shape in the particular embodiment of FIG. 9 somewhat flattens the curvature of the ceiling 62 around the center portion of the ceiling 62, the peripheral portion of the ceiling 62 having a steeper curvature.

As illustrated in FIG. 10 the coil inductor 68 may be coupled to the RF power source 78, 80 in a mirror coil configuration that is known to those skilled in the art. In the mirror coil configuration of FIG. 10, the RF source 78, 80 is connected to the center winding of the coil inductor 68 while the top and bottom ends of the coil inductor 68 are both grounded. The mirror coil configuration has the advantage of reducing the maximum potential on the coil inductor 68.

The broadly preferred reactor conditions for a suitable inductively coupled RF plasma reactor, such as the inductively coupled RF plasma reactor 90 in FIGS. 9 and 10, in etching the tungsten silicide layer 22 and the polysilicon layer 16 are as follows:

| | |
|---|---|
| Pressure | 0.5 to 50 mTorr |
| RF Power to Coil Inductor | 100 to 3000 watts |
| RF Power to Wafer Pedestal | 50 to 1500 watts |
| RF Frequency in Coil Inductor | 100 K to 200 MHz |
| RF Frequency in Wafer Pedestal | 100 K to 200 MHz |
| Temperature of Wafer | 20 to 100° C. |
| Tungsten Silicide Etch Rate | 1500 to 3000 Angstrom/min |
| Polysilicon Etch Rate | 200 to 4000 Angstrom/min |
| Selectivity of $WSi_x$/Poly | .5:1 to 2:1 |
| Selectivity of Poly/Gate Oxide | 2:1 to 200:1 |

More generally, the process parameters for etching the tungsten silicide layer 22 and polysilicon layer 16 in a suitable inductively coupled plasma reactor, such as the inductively coupled plasma reactor 90 in FIGS. 9 and 10, fall into ranges as listed on the basis of flow rates of the gases, including the halogen gas(es) (i.e., $Cl_2$) and the carbon monoxide gas, as listed in Table I below.

TABLE I

| Process | Broad | Preferred | Optimum |
|---|---|---|---|
| Gas Flow, sccm | | | |
| $Cl_2$ | 5 to 200 | 40 to 140 | 60 to 100 |
| CO | 2 to 100 | 4 to 70 | 10 to 40 |
| Pressure, mT | 0.5 to 50 | 5 to 15 | 7 to 10 |
| RF Power of Coil Inductor (Watts) | 100 to 3000 | 200 to 1200 | 300 to 1000 |
| RF Power of Wafer Pedestal (Watts) | 20 to 500 | 30 to 300 | 30 to 100 |
| Temperature of Wafer (° C.) | 20 to 100 | 30 to 90 | 40 to 80 |
| Tungsten Silicide Etch Rate (Å/min) | 1500 to 3000 | 2000 to 2500 | 2200 to 2400 |
| Polysilicon Etch Rate (Å/min) | 200 to 4000 | 500 to 3000 | 1000 to 2000 |
| RF Frequency of Coil Inductor | 100 K to 200 MHz | 400 K to 20 MHz | 2 to 13.5 MHz |
| RF Frequency of Wafer Pedestal | 100 K to 200 MHz | 400 K to 20 MHz | 400 K to 13.5 MHz |
| Selectivity of $WSi_x$/Poly | .5:1 to 2:1 | .5:1 to 1.5:1 | 1:1 to 1.5:1 |
| Selectivity of Poly/Gate Oxide | 2:1 to 200:1 | 10:1 to 200:1 | 10:1 to 50:1 |

More generally also, the process parameters for etching the tungsten silicide layer 22 with an etchant gas comprising the halogen gas(es) (i.e., chlorine), carbon monoxide, and a nitrogen-containing gas (i.e., $N_2$), fall into ranges as listed on the basis of flow rates of these etchant gases, as listed in Table II below.

TABLE II

| Process | Broad | Preferred | Optimum |
|---|---|---|---|
| Gas Flow, sccm | | | |
| $Cl_2$ | 5 to 200 | 40 to 140 | 60 to 100 |
| CO | 2 to 100 | 4 to 70 | 10 to 40 |
| Nitrogen-containing gas (i.e., $N_2$) | 2 to 100 | 4 to 70 | 10 to 20 |
| Pressure, mT | 0.5 to 50 | 5 to 15 | 7 to 10 |
| RF Power of Coil Inductor (Watts) | 100 to 3000 | 200 to 1200 | 300 to 1000 |
| RF Power of Wafer Pedestal (Watts) | 20 to 500 | 30 to 300 | 30 to 100 |
| Temperature of Wafer (° C.) | 20 to 100 | 30 to 90 | 40 to 80 |
| Tungsten Silicide Etch Rate (Å/min) | 1500 to 3000 | 2000 to 2500 | 2200 to 2400 |
| RF Frequency of Coil Inductor | 100 K to 200 MHz | 400 K to 20 MHz | 2 to 13.5 MHz |
| RF Frequency of Wafer Pedestal | 100 K to 200 MHz | 400 K to 20 MHz | 400 K to 13.5 MHz |
| Selectivity of $WSi_x$/Poly | .5:1 to 2:1 | .5:1 to 1.5:1 | 1:1 to 1.5:1 |

More generally further, and when the etchant gases are a mixture of the halogen gas(es) (i.e., chlorine), the carbon monoxide gas, and HBr and/or $BCl_3$, the process parameters for etching the polysilicon layer 16 in a suitable inductively coupled plasma reactor, such as the inductively coupled plasma reactor 90 in FIGS. 9 and 10, fall into the ranges as listed on the basis of flow rates of the gases, including the halogen gas(es) (i.e., $Cl_2$) and the carbon monoxide gas and HBr and/or $BCl_3$ gas, as listed in Table III below:

TABLE III

| Process | Broad | Preferred | Optimum |
|---|---|---|---|
| Gas Flow, sccm | | | |
| $Cl_2$ | 5 to 200 | 40 to 140 | 60 to 100 |
| CO | 2 to 100 | 4 to 70 | 10 to 40 |
| HBr and/or $BCl_3$ | 5 to 200 | 40 to 140 | 60 to 100 |
| Pressure, mT | 0.5 to 50 | 5 to 15 | 7 to 10 |
| RF Power of Coil Inductor (Watts) | 100 to 3000 | 200 to 1200 | 300 to 1000 |
| RF Power of Wafer Pedestal (Watts) | 20 to 500 | 30 to 300 | 30 to 100 |
| Temperature of Wafer (° C.) | 20 to about 100 | 30 to 90 | 40 to 80 |
| Polysilicon Etch Rate (Å/min) | 200 to 4000 | 500 to 3000 | 1000 to 2000 |
| RF Frequency of Coil Inductor | 100 K to 200 MHz | 400 K to 20 MHz | 2 to 13.5 MHz |
| RF Frequency of Wafer Pedestal | 100 K to 200 MHz | 400 K to 20 MHz | 400 K to 13.5 MHz |
| Selectivity of Poly/Gate Oxide | 2:1 to 200:1 | 10:1 to 200:1 | 10:1 to 50:1 |

Therefore, the foregoing process conditions are preferably based on flow rates of etchant gas(es) having a flow rate value ranging from about 5 to about 500 sccm, more preferably from about 50 to 200 sccm, and most preferably from about 100 to about 150 sccm. As was previously mentioned, the etchant gas broadly comprises, or consists of or consists essentially, of a halogen (preferably chlorine) and carbon monoxide. The etchant gas more specifically broadly comprises from about 10% by volume to about 99% by volume of the halogen gas (i.e., chlorine) and from about 1% by volume to about 90% by volume of the carbon monoxide gas; preferably from about 30% by volume to about 90% by volume of the halogen gas (i.e., chlorine) and from about 10% by volume to about 70% by volume of the carbon monoxide gas; more preferably from about 70% by volume to about 80% by volume of the halogen gas (i.e., chlorine) and from about 20% by volume to about 30% by volume of the carbon monoxide gas. In a more preferred embodiment of the invention and as was previously mentioned, the etchant gas for etching the tungsten silicide layer 22 comprises, preferably consists of or consists essentially of, the halogen (i.e., chlorine), the carbon monoxide gas, and a nitrogen-containing gas (e.g. nitrogen, $N_2$). The etchant gas more specifically comprises, or consists of or consists essentially of, from about 10% by volume to about 99% by volume of the halogen gas (i.e., chlorine) and from about 1% by volume to about 90% by volume of the carbon monoxide gas and from about 10% by volume to about 99% by volume of nitrogen-containing gas (i.e., $N_2$); preferably from about 20% by volume to about 80% by volume of the halogen gas (i.e., chlorine) and from about 20% by volume to about 80% by volume of the carbon monoxide gas and from about 20% by volume to about 80% by volume of nitrogen-containing gas (e.g. nitrogen, $N_2$); and more preferably from about 40% by volume to about 80% by volume of the halogen gas (i.e., chlorine) and from about 20% by volume to about 30% by volume of the carbon monoxide gas and from about 20% by volume to about 30% by volume of nitrogen-containing gas (e.g. nitrogen, $N_2$). In another preferred embodiment of the invention and as was previously mentioned, the etchant gas for etching the polysilicon layer 16 comprises, preferably consists of or consists essentially of, the halogen (i.e., chlorine), the carbon monoxide gas, and a gas selected from the group consists of HBr, $BCl_3$ and mixtures thereof. The etchant gas for etching the polysilicon layer 16 more specifically comprises, or consists of or consists essentially of, from about 10% by volume to about 99% by volume of the halogen gas (i.e., chlorine) and from about 1% by volume to about 90% by volume of the carbon monoxide gas and from about 10% by volume to about 99% by volume of HBr and/or $BCl_3$; preferably from about 20% by volume to about 80% by volume of the halogen gas (i.e., chlorine) and from about 20% by volume to about 80% by volume of the carbon monoxide gas and from about 20% by volume to about 80% by volume of HBr and/or $BCl_3$; and more preferably from about 40% by volume to about 80% by volume of the halogen gas (i.e., chlorine) and from about 20% by volume to about 30% by volume of the carbon monoxide gas and from about 40% by volume to about 80% by volume of HBr and/or $BCl_3$. Thus, the foregoing process conditions stated in Tables I, II and III may be based on such etchant gas constituency and on such percent (%) by volume value(s).

After the tungsten silicide layer 22 and the polysilicon layer 16 have been etched to produce respectively the etched tungsten silicide members 22a, 22b, 22c and 22d and the etched polysilicon members 16a, 16b, 16c and 16d, the mask layers 18r, 18b, 18c and 18d (if not completely removed during the etching process) typically remain on top of the etched tungsten silicide members 22a, 22b, 22c and 22d which are respectively supported by the etched polysilicon members 16a, 16b, 16c and 16d, all as best shown in FIG. 6. For the embodiment of the invention illustrated in FIG. 1, the resist members 20a, 20b, 20c and 20d remain on top of the etched tungsten silicide members 22a, 22b, 22c and 22d as best shown in FIG. 5. The mask layers 18a, 18b, 18c and 18d are to be removed by any suitable means and/or in any suitable manner, such as by $CF_4$/Ar plasma, in the previously mentioned DPS™ brand chamber of the plasma processing apparatus of FIGS. 9 and 10. Likewise for the embodiment of the invention depicted in FIG. 5, the resist members 20a, 20b, 20c and 20d may be removed from the etched tungsten silicide layers 22a, 22b, 22c and 22d by any suitable means and/or in any suitable manner such as in the DPS™ brand etch chamber of the plasma processing apparatus of FIGS. 9 and 10.

Figure 7:
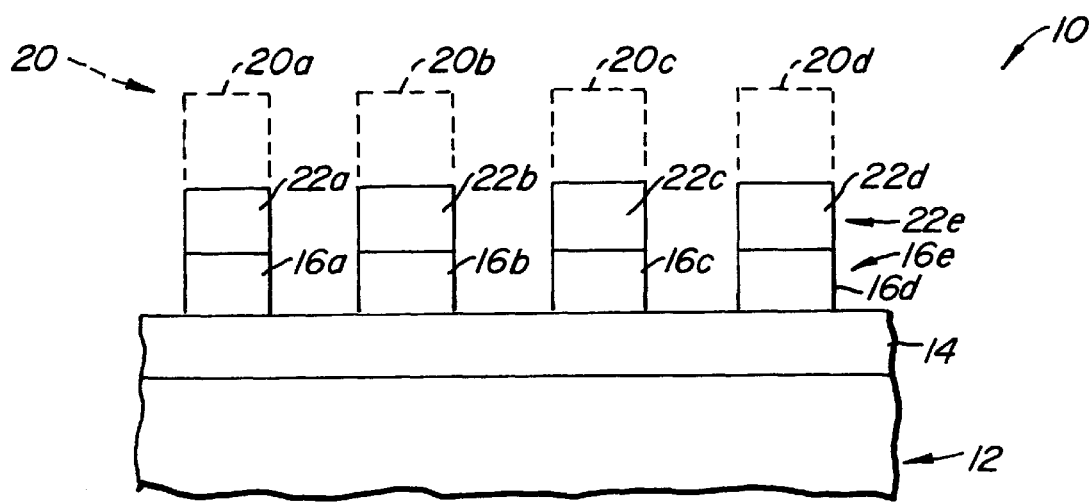
FIG. 7 is a side sectional view of the semiconductor wafer of FIG. 5 with the resist members having been removed from the etched tungsten silicide layer with the removed resist members being represented by broken lines.
Figure 8:
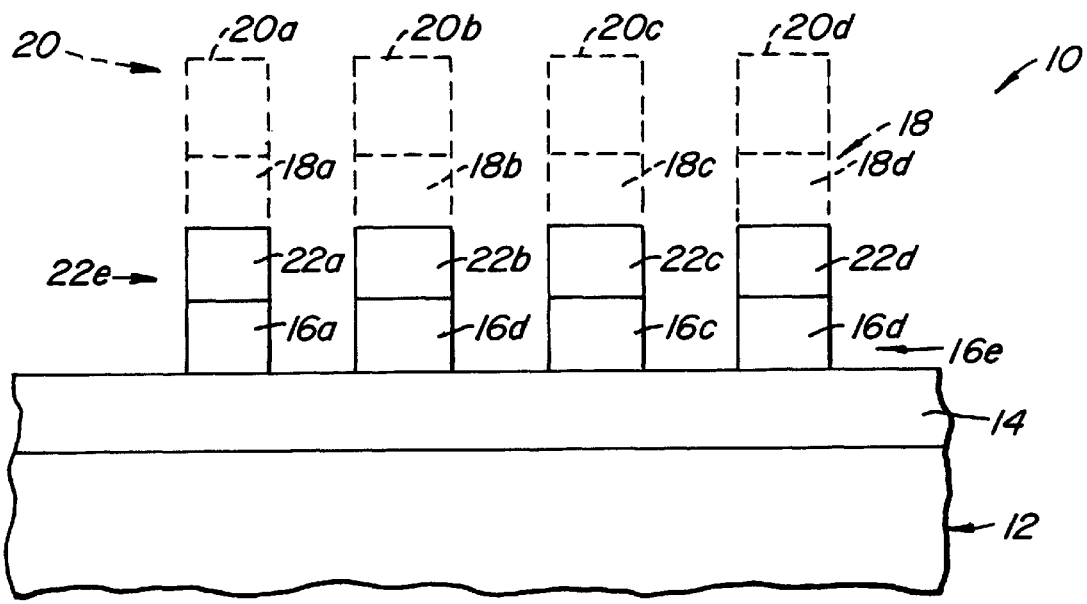
FIG. 8 is a side sectional view of the semiconductor wafer of FIG. 6 after the mask members have been removed from the etched tungsten silicide layer, with the removed resist members and the removed mask members being represented by broken lines.

After removal of residual mask layers 18a, 18b, 18c and 18d, or the resist members 20a, 20b, 20c and 20d for the embodiment of the invention illustrated in FIG. 5, the etched tungsten silicide/polysilicon layered structure of FIG. 7 or 8 remains, with the dotted line representation of resist 20 in FIG. 7 and resist mask layer 18 in FIG. 8 representing layers or members which have been removed.

The invention will be illustrated by the following set forth example which is being given to set forth the presently known best mode and by way of illustration only and not by way of any limitation. All parameters such as concentrations, mixing proportions, temperatures, pressure, rates, compounds, etc., submitted in this example are not to be construed to unduly limit the scope of the invention.

EXAMPLE I

A test semiconductor wafer was formulated with the following film stack:

1.0 $\mu$m PR (photoresist)/3000 Å Polysilicon/1000 Å Gate Oxide.

The feature size of the formulated test semiconductor wafer was 0.4 $\mu$m line width and 0.4 $\mu$m spacing.

The polysilicon layer was etched with $Cl_2$, CO and HBr as the etchant gases and in a DPS™ brand chamber of a plasma processing apparatus sold under the trademark Metal Etch DPS Centura™, owned by Applied Materials Inc., 3050 Bowers Avenue, Santa Clara, Calif. 95054-3299. The reactor and process conditions were as follows:

| Reactor Conditions | |
|---|---|
| Pressure | 6 mTorr |
| RF Power to Coil Inductor | 600 watts |
| RF Power to Wafer Pedestal | 80 watts |
| Temperature of Wafer Pedestal | 110° C. |
| Polysilicon Etch Rate | 2000 Å/min |
| Process Conditions Based on the Flow Rate of $Cl_2$, CO and HBr | |
| $Cl_2$ | 60 sccm |
| CO | 5 sccm |
| HBr | 120 sccm |
| Pressure | 6 mTorr |
| RF Power to Coil Inductor | 600 watts |
| RF Power to Wafer Pedestal | 80 watts |
| Temperature of Wafer Pedestal | 50° C. |
| Polysilicon Etch Rate | 2000 Å/min |

Figure 11:
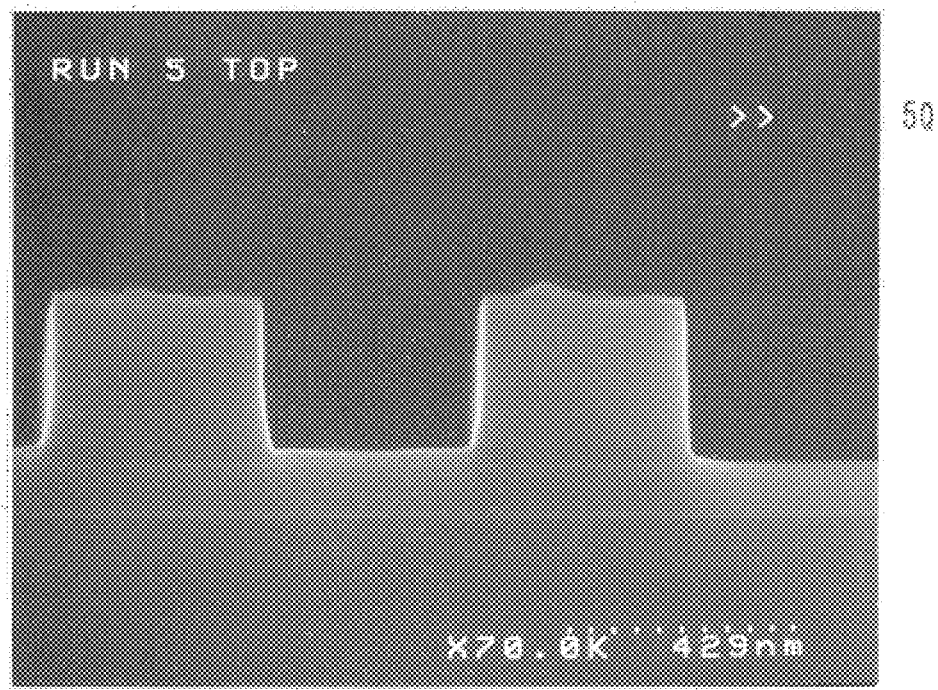
FIG. 11 is a side sectional view of a circumferential edge of the test semiconductor wafer of Example I.
Figure 12:
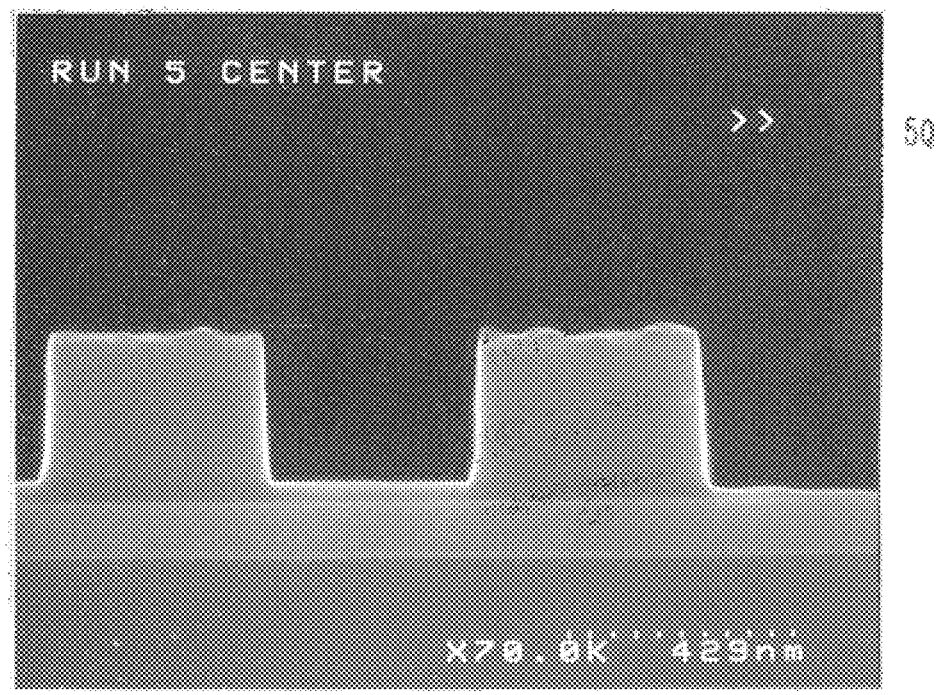
FIG. 12 is a center sectional view of the test semiconductor wafer of Example I.

The resulting etched Polysilicon layer of the test semiconductor wafer is shown in FIGS. 11 and 12, with FIG. 11 being a side sectional view of a circumferential edge of the test semiconductor wafer and with FIG. 12 being a center sectional view of the test semiconductor wafer. As shown in FIGS. 11 and 12, the gate oxide layer had no microtrenching and the profile was about 89°.

EXAMPLE II

Figure 13:
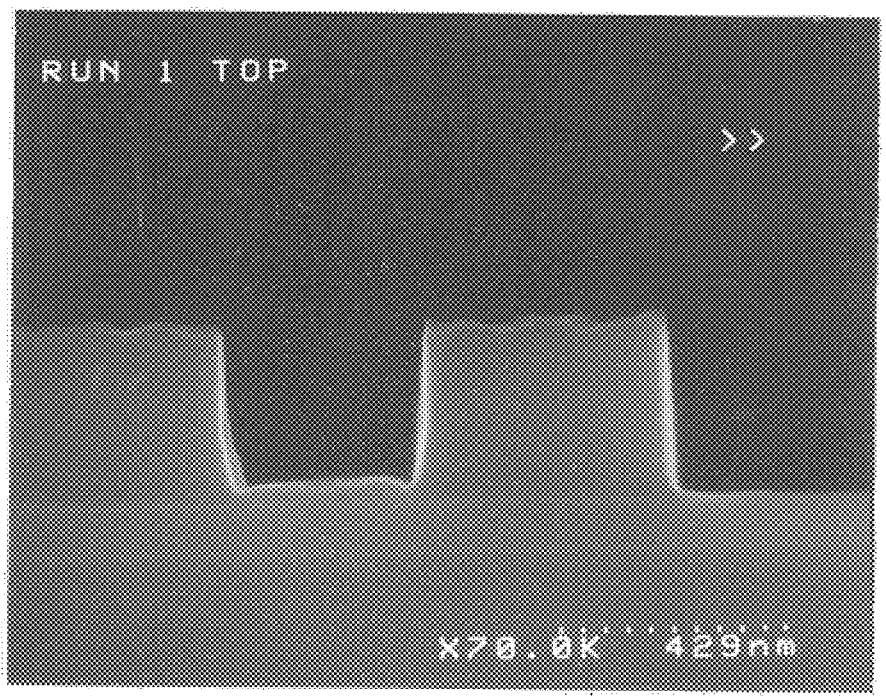
FIG. 13 is a side sectional view of a circumferential edge of the test semiconductor wafer of Example II.
Figure 14:
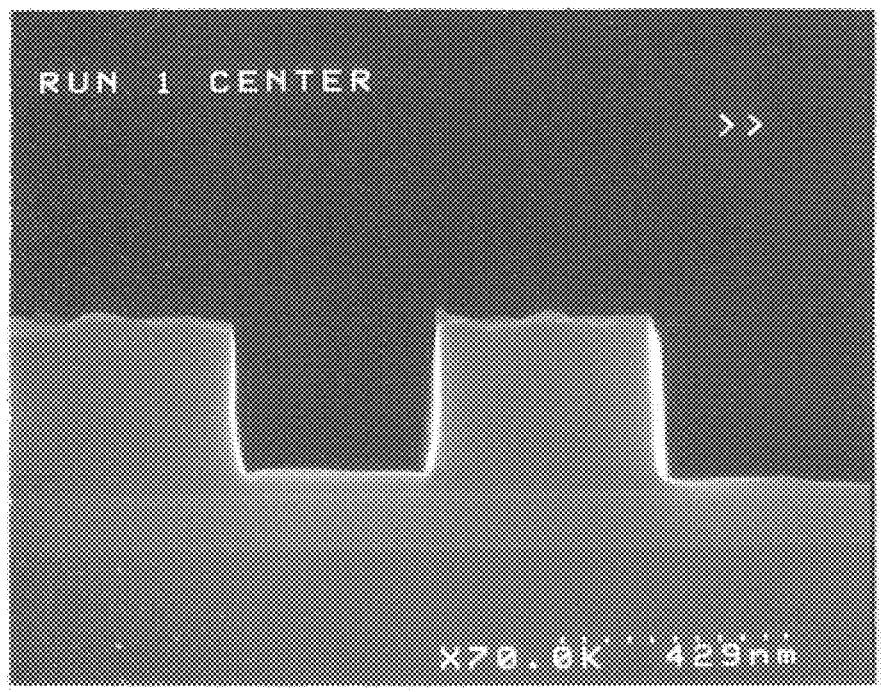
FIG. 14 is a center sectional view of the test semiconductor wafer of Example II.

Repeat Example I, but replace the 5 sccm of CO with 6 sccm of He:$O_2$ (i.e., 70% by volume He and 30% by volume $O_2$). The resulting etched polysilicon layer of the test semiconductor wafer is shown in FIGS. 13 and 14, with FIG. 13 being a side sectional view of a circumferential edge of the test semiconductor wafer and with FIG. 14 being a center sectional view of the test semiconductor wafer. As shown in FIGS. 13 and 14, the gate oxide layer had microtrenching.

EXAMPLE III

Figures 15, 16, 17:
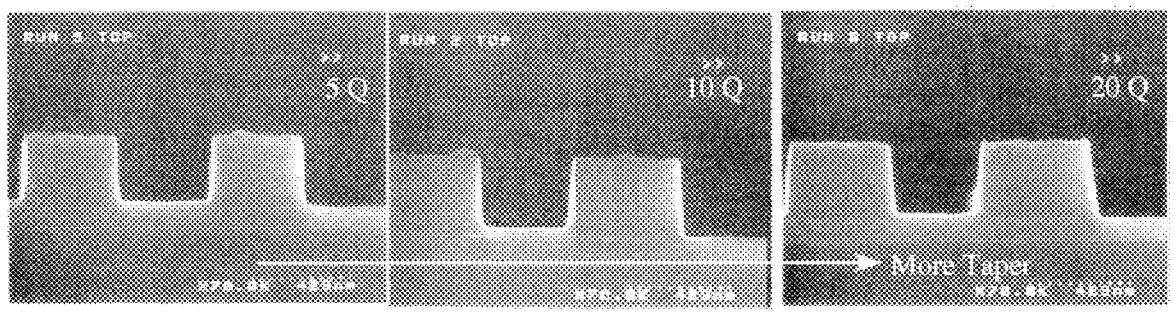
FIG. 15 is a side sectional view of a semicircumferential edge of the test semiconductor wafer of Example III for an etchant gas comprising CO having a flow rate of 5 sccm.
FIG. 16 is a side sectional view of a circumferential edge of the test semiconductor wafer of Example III for an etchant gas comprising CO having a flow rate of 10 sccm.
FIG. 17 is a side sectional view of a circumferential edge of the test semiconductor wafer of Example III for an etchant gas comprising CO having a flow rate of 20 sccm.

Repeat Example I with 5 sccm of CO, and then with 10 sccm of CO, and lastly with 20 sccm of CO. The resulting etched polysilicon layer for each test semiconductor wafer for the CO flow rates of 5 sccm, 10 sccm and 20 sccm are respectively shown in FIGS. 15, 16 and 17. The polysilicon profiles were 89°, 87°, and 85° in FIGS. 15, 16 and 17, respectively. The gate oxide layers had no microtrenching, and when the CO flow rates increased from 5 sccm to 10 sccm and then from 10 sccm to 20 sccm, the polysilicon profiles decreased and became more tapered. Thus, the polysilicon profiles can be controlled by varying the amount of CO gas in the etchant gas.

EXAMPLE IV

Figure 18:
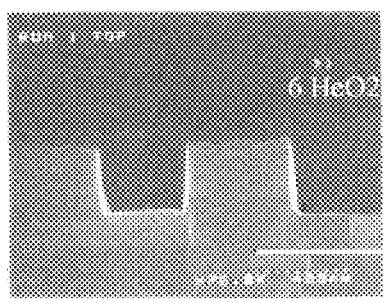
FIG. 18 is a side sectional view of a circumferential edge of the test semiconductor wafer of Example IV for an etchant gas comprising $He:O_2$ having a flow rate of 6 sccm.
Figure 19:
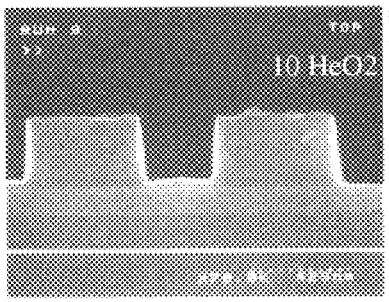
FIG. 19 is a side sectional view of a circumferential edge of the test semiconductor wafer of Example IV for an etchant gas comprising $He:O_2$ having a flow rate of 10 sccm.
Figure 20:
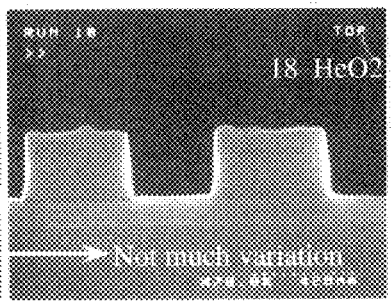
FIG. 20 is a side sectional view of a circumferential edge of the test semiconductor wafer of Example IV for an etchant gas comprising $He:O_2$ having a flow rate of 18 sccm.

Repeat Example I, but replace the 5 sccm of CO with 6 sccm of He:$O_2$; and then replace the 5 sccm of CO with 10 sccm of HE:$O_2$; and lastly replace the 5 sccm of CO with 18 sccm of He:$O_2$. The resulting etched polysilicon layer for each test semiconductor wafer for the He:$O_2$ flow rates of 6 sccm, 10 sccm and 18 sccm are respectively shown in FIGS. 18, 19 and 20. In all cases, the polysilicon profiles were 88° and the gate oxide layers had microtrenching. Thus, when the etchant gas included He:$O_2$ instead of CO, there was no control over the polysilicon profile, regardless of the amount of He:$O_2$ employed.

EXAMPLE V

A test semiconductor wafer was formulated with the following film stack:

1.0 μm PR (photoresist)/2500 Å Oxide/1500 Å WSi$_x$/1500 Å Polysilicon/100 Å Gate Oxide.

The feature size of the formulated test semiconductor wafer was 0.2 μm line width and 0.4 μm spacing. The oxide hard mask (i.e. the mask layer) was opened in a DPS™ brand chamber of a plasma processing apparatus sold under the trademark Metal Etch DPS Centura™, owned by Applied Materials Inc., 3050 Bowers Avenue, Santa Clara, Calif. 95054-3299. The etchant gas for opening up the oxide hard mask comprised about 70% by volume Ar and about 30% by volume $CF_4$. The reactor and process conditions were as follows:

| Reactor Conditions | |
| --- | --- |
| Pressure | 5 mTorr |
| RF Power to Coil Inductor | 500 watts |
| RF Power to Wafer Pedestal | 200 watts |
| Temperature of Wafer Pedestal | 65° C. |
| Oxide Hard Mask Etch Rate | 2000 Å/min |
| Process Conditions Based on the Flow Rate of Ar and $CF_4$ | |
| $CF_4$ | 50 sccm |
| Ar | 100 sccm |
| Pressure | 5 mTorr |
| RF Power to Coil Inductor | 500 watts |
| RF Power to Wafer Pedestal | 200 watts |
| Temperature of Wafer Pedestal | 65° C. |
| Oxide Hard Mask Etch Rate | 2000 Å/min |

The photoresist was stripped from the oxide hard mask in the same DPS™ brand chamber of the Metal Etch DPS Centura™ brand plasma processing apparatus using $O_2/N_2$ plasma.

The WSi$_x$ layer was etched with $Cl_2$, CO and $N_2$ as the etchant gases and in the same DPS™ brand chamber of the metal Etch DPS Centura™ brand plasma processing apparatus under the following reactor and process conditions:

| Reactor Conditions | |
| --- | --- |
| Pressure | 4 mTorr |
| RF Power to Coil Inductor | 700 watts |
| RF Power to Wafer Pedestal | 70 watts |
| Temperature of Wafer Pedestal | 65° C. |
| WSi$_x$ Rate | 2800 Å/min |
| Process Conditions Based on the Flow Rate of $Cl_2$, CO and $N_2$ | |
| $Cl_2$ | 120 sccm |
| CO | 10 sccm |
| $N_2$ | 10 sccm |
| Pressure | 4 mTorr |
| RF Power to Coil Inductor | 700 watts |
| RF Power to Wafer Pedestal | 70 watts |
| Temperature of Wafer Pedestal | 65° C. |
| WSi$_x$ Etch Rate | 2800 Å/min |

The polysilicon layer was then etched with $Cl_2$, CO and HBr as the etchant gases and in the same DPS™ brand chamber of the metal Etch DPS Centura™ brand plasma processing apparatus under the following reactor and process conditions:

| Reactor Conditions | |
| --- | --- |
| Pressure | 4 mTorr |
| RF Power to Coil Inductor | 600 watts |
| RF Power to Wafer Pedestal | 100 watts |
| Temperature of Wafer Pedestal | 65° C. |
| Polysilicon Etch Rate | 2000 Å/min |
| Process Conditions Based on the Flow Rate of $Cl_2$, CO and HBr | |
| $Cl_2$ | 50 sccm |
| CO | 15 |
| HBr | 100 sccm |
| Pressure | 4 mTorr |
| RF Power to Coil Inductor | 600 watts |
| RF Power to Wafer Pedestal | 100 watts |
| Temperature of Wafer Pedestal | 65° C. |
| Polysilicon Etch Rate | 2000 Å/min |

Figure 21:
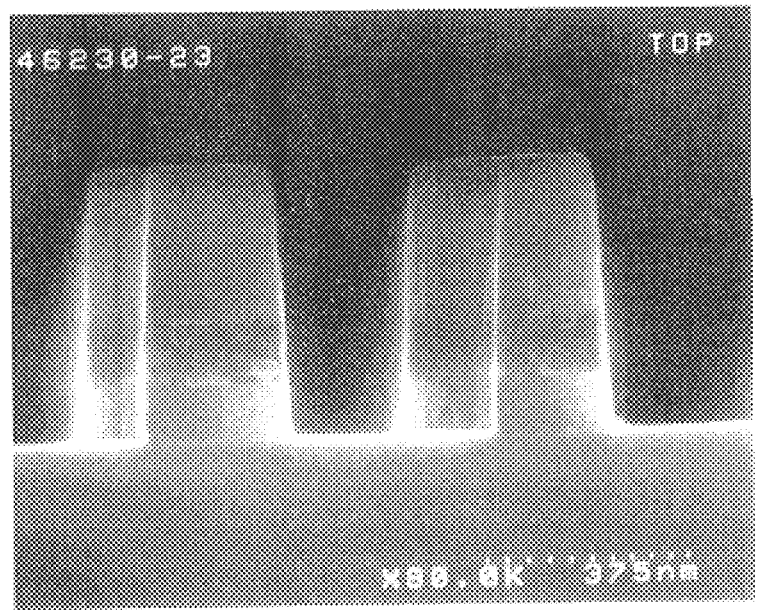
FIG. 21 is a side sectional view of a circumferential edge of the test semiconductor wafer of Example V.

The resulting etched WSi$_x$ and polysilicon layers of the test semiconductor wafer are shown in FIG. 21 wherein a profile of about 89 degrees is shown with the gate oxide layer not having any microtrenches. As further shown in FIG. 21, the profile is smooth (i.e., the edges are straight with no waviness). The resulting gate oxide layer contained no microtrenches and had a thickness of about 90 Å. Thus, the erosion of the gate oxide layer was about 10 Å (i.e., from a 100 Å thickness to about a 90 Å thickness).

EXAMPLE VI

Figure 22:
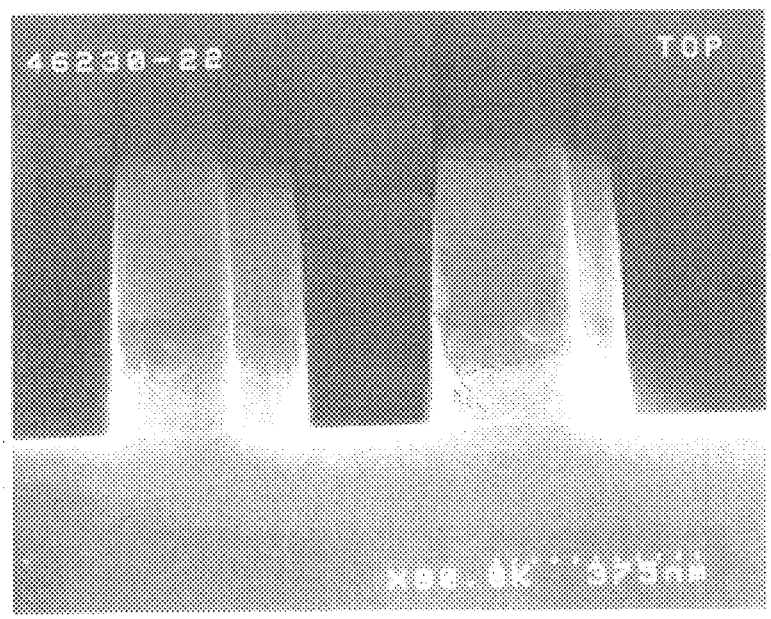
FIG. 22 is a side sectional view of a circumferential edge of the test semiconductor wafer of Example VI.

Repeat Example V, but replace the 10 sccm of CO for etching WSi$_x$ and the 15 sccm of CO for etching polysilicon with 6 sccm of $O_2$ in both instances. The resulting etched WSi$_x$ and polysilicon layers of the test semiconductor wafer are shown in FIG. 22 wherein the profile is not smooth, but is wavy (i.e., the edges are not straight). The resulting gate oxide layer had a thickness of about 50 Å. Thus, the gate oxide layer eroded about 50 Å (i.e., from a 100 Å thickness to about a 50 Å thickness). Replacing oxygen with CO lowers gate oxide erosion.

Conclusion

Thus, by the practice of the present invention there is provided an etchant gas and a method for etching of the tungsten silicide layer 22 and the polysilicon layer 16. The etchant gas broadly comprises from about 10% to about 99% by vol. $Cl_2$, and from about 1% to about 90% by vol. CO. The etched tungsten silicide layer 22 and the etched polysilicon layer 16 includes, respectively, a plurality of etched tungsten silicide members 22a, 22b, 22c and 22d and a plurality of etched polysilicon members 16a, 16b, 16c and 16d. The profile of the etched tungsten silicide layer 22/polysilicon layer 16 includes an angle which is equal to or greater than about 85 degrees. The respective imposed stacked members (i.e., members 22a/16b, etc. are separated by a distance or space having a dimension equal to or less than about 0.3 $\mu$m. Each of the respective imposed or stacked members include a dimension having a value equal to or less than about 0.6 $\mu$m, preferably equal to or less than about 0.3 $\mu$m. More preferably, each of the respective imposed or stacked members has a width equal to or less than about 0.3 $\mu$m, a length equal to or less than about 0.6 $\mu$m, and a height equal to or less than about 0.6 $\mu$m. The trenches or troughs between the produced etched $WSi_x$/ Polysilicon layers are ideally suited for receiving a dielectric (e.g., a TEOS layer) in producing a semiconductor device.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

What is claimed is:

1. A method for etching at least one conductive layer on a substrate comprising the steps of:
    (a) providing a substrate support at least one conductive layer; and
    (b) etching the conductive layer in a high density plasma of an etchant gas comprising a halogen gas and carbon monoxide (CO) to produce said substrate of step (a) supporting an etched conductive layer.

2. The method of claim 1 wherein said providing step (a) additionally includes providing a gate oxide layer disposed on said substrate between said substrate and said at least one conductive layer, and said etching step (b) forms essentially no microtrenches in said gate oxide layer.

3. The method of claim 1 wherein said conductive layer comprises a polysilicon layer, and a tungsten silicide layer supported by said polysilicon layer.

4. The method of claim 2 wherein said conductive layer comprises a polysilicon layer, and a tungsten silicide layer supported by said polysilicon layer.

5. The method of claim 3 wherein said tungsten silicide layer is etched in a high density plasma of an etchant gas consisting essentially of a halogen gas, carbon monoxide (CO), and nitrogen, and said polysilicon layer is etched in a high density plasma of an etchant gas consisting essentially of a halogen gas, carbon monoxide (CO), and hydrogen bromide (HBr).

6. The method of claim 4 wherein said tungsten silicide layer is etched in a high density plasma of an etchant gas consisting essentially of a halogen gas, carbon monoxide (CO), and nitrogen, and said polysilicon layer is etched in a high density plasma of an etchant gas consisting essentially of a halogen gas, chlorine ($Cl_2$), carbon monoxide (CO), and hydrogen bromide (HBr).

7. The method of claim 1 wherein said etchant gas comprises from about 10% by vol. to about 99% by vol. halogen gas and from about 1% by vol. to about 90% by vol. carbon monoxide (CO).

8. The method of claim 5 wherein said etchant gas for etching said tungsten silicide layer consists essentially of from about 10% by vol. to about 99% by vol. halogen gas, and from about 1% by vol. to about 90% by vol. carbon monoxide (CO) and from about 10% by vol. to about 99% by volume nitrogen ($N_2$).

9. The method of claim 5 wherein said etchant gas for etching said polysilicon layer consists essentially of from about 10% by vol. to about 99% by vol. halogen gas; from about 1% by vol. to about 90% by vol. carbon monoxide (CO); and from about 10% by vol. to about 99% by vol. hydrogen bromide (HBr).

10. The method of claim 1 additionally comprising disposing, prior to said etching step (b), said substrate of step (a) in a high density plasma chamber including a coil inductor and a wafer pedestal; and performing said etching step (b) in said high density plasma chamber under the following process conditions:

| Process | Parameters |
| --- | --- |
| Etchant Gas Flow | 10 to 400 sccm |
| Pressure, mTorr | 0.5 to 50 milliTorr |
| RF Power (watts) of Coil Inductor | 100 to 3000 watts |
| RF Power (watts) of Wafer Pedestal | 50 to 1500 watts |
| Temperature (° C.) of Substrate | 20 to 100° C. |
| Conductive Layer Etch Rate (Å/min) | 200 to 4000 Å/min |
| RF Frequency of Coil Inductor | 100 K to 200 MHz |
| RF Frequency of Wafer Pedestal | 100 K to 200 MHz. |

11. The method of claim 9 additionally comprising disposing, prior to said etching step (b), said substrate of step (a) in a high density plasma chamber including a coil inductor and a wafer pedestal; and performing said etching step (b) in said high density plasma chamber under the following process conditions:

| Process | Parameters |
| --- | --- |
| Etchant Gas Flow | 10 to 400 sccm |
| Pressure, mTorr | 0.5 to 50 milliTorr |
| RF Power (watts) of Coil Inductor | 100 to 3000 watts |
| RF Power (watts) of Wafer Pedestal | 50 to 1500 watts |
| Temperature (° C.) of Substrate | 20 to 100° C. |
| Conductive Layer Etch Rate (Å/min) | 200 to 4000 Å/min |
| RF Frequency of Coil Inductor | 100 K to 200 MHz |
| RF Frequency of Wafer Pedestal | 100 K to 200 MHz. |

12. A method for etching a polysilicon layer supporting a tungsten-silicide layer comprising the steps of:
    (a) providing a substrate supporting a polysilicon layer having a tungsten-silicide layer disposed thereon;
    (b) providing an etchant gas comprising carbon monoxide (CO), a halogen gas, and nitrogen ($N_2$);
    (c) etching said tungsten-silicide layer of step (a) with said etchant gas of step (b) to remove at least a portion of said tungsten-silicide layer to expose at least part of said polysilicon layer;
    (d) providing an etchant gas comprising said carbon monoxide (CO), a halogen gas, and a gas selected from the group consisting of hydrogen bromide (HBr), boron trichloride ($BCl_3$), and mixtures thereof; and
    (e) etching said exposed part of said polysilicon layer with said etchant gas of step (d).

13. The method of claim 12 wherein said providing step (a) additionally includes providing a gate oxide layer disposed on said substrate between said substrate and said polysilicon layer, and said etching step (e) forms essentially no microtrenches in said gate oxide layer.

14. The method of claim 12 wherein said etchant gas of step (b) consists essentially of the halogen gas, carbon monoxide (CO), and nitrogen ($N_2$).

15. The method of claim 13 wherein said etchant gas of step (d) consists essentially of the halogen gas, carbon monoxide (CO), and the gas selected from the group consisting of hydrogen bromide (HBr), boron trichloride (BCl$_3$), and mixtures thereof.

16. The method of claim 12 wherein said etchant gas of step (b) comprises from about 10% by vol. to about 99% by vol. the halogen gas, and from about 1% by vol. to about 90% by vol. carbon monoxide (CO), and from about 10% by vol. to about 99% by vol. nitrogen (N$_2$).

17. The method of claim 12 wherein said etchant gas of step (b) consists essentially of from about 10% by vol. to about 99% by vol. the halogen gas, and from about 1% by vol. to about 90% by vol. carbon monoxide (CO), and from about 10% by vol. to about 99% by vol. nitrogen (N$_2$).

18. The method of claim 12 wherein said etchant gas of step (d) comprises from about 10% by vol. to about 99% by vol. of the halogen gas; from about 1% by vol. to about 90% by vol. carbon monoxide (CO), and from about 10% by vol. to about 99% by vol. of the gas selected from the group consisting of hydrogen bromide (HBr), boron trichloride (BCl$_3$), and mixtures thereof.

19. The method of claim 12 wherein said etchant gas of step (d) consists essentially of from about 10% by vol. to about 99% by vol. of the halogen gas, from about 1% by vol. to about 90% by vol. carbon monoxide (CO), and from about 10% by vol. to about 99% by vol. of the gas selected from the group consisting of hydrogen bromide (HBr), boron trichloride (BCl$_3$), and mixtures thereof.

20. The method of claim 12 additionally comprising disposing, prior to said etching step (c), said substrate of step (a) in a high density plasma chamber including a coil inductor and a wafer pedestal; and performing said etching step (c) in said high density plasma chamber under the following process conditions:

| Process | Parameters |
| --- | --- |
| Carbon Monoxide (CO) | 1 to 90% by vol. |
| Chlorine (Cl$_2$) | 10 to 99% by vol. |
| Nitrogen (N$_2$) | 10 to 99% by vol. |
| Pressure, mTorr | 0.5 to 50 milliTorr |
| RF Power (watts) of Coil Inductor | 100 to 3000 watts |
| RF Power (watts) of Wafer Pedestal | 50 to 1500 watts |
| Temperature (° C.) of Substrate | 20 to 100° C. |
| Tungsten-Silicide Etch Rate (Å/min) | 1500 to 3000 (Å/min) |
| RF Frequency of Coil Inductor | 100 K to 200 MHz |
| RF Frequency of Wafer Pedestal | 100 K to 200 MHz |

21. The method of claim 12 additionally comprising disposing, prior to said etching step (e), said substrate after step (c) in a high density plasma chamber including a coil inductor and a wafer pedestal; and performing said etching step (e) in said high density plasma chamber under the following process conditions:

| Process | Parameters |
| --- | --- |
| Carbon Monoxide (CO) | 1 to 90% by vol. |
| Chlorine (Cl$_2$) | 10 to 99% by vol. |
| Hydrogen Bromide (HBr) | 10 to 99% by vol. |
| Pressure, mTorr | 0.5 to 50 milliTorr |
| RF Power (watts) of Coil Inductor | 100 to 3000 watts |
| RF Power (watts) of Wafer Pedestal | 50 to 1500 watts |
| Temperature (° C.) of Substrate | 20 to 100° C. |
| Polysilicon Etch Rate (Å/min) | 200 to 4000 Å/min |
| RF Frequency of Coil Inductor | 100 K to 200 MHz |
| RF Frequency of Wafer Pedestal | 100 K to 200 MHz |

22. A method for producing a semiconductor device comprising the steps of:

(a) forming a patterned hardmask layer, a tungsten silicide layer, a polysilicon layer, and a gate oxide layer on a silicon substrate;

(b) etching a portion of the tungsten silicide layer with an etchant gas comprising carbon monoxide (CO), a halogen gas, and nitrogen (N$_2$) to remove said portion of tungsten silicide layer from said polysilicon layer to produce said silicon substrate supporting said patterned hardmask layer, a residual tungsten silicide layer, said polysilicon layer, and said gate oxide layer; and (c) etching said polysilicon layer with an etchant gas comprising carbon monoxide (CO), a halogen gas, and a gas selected from the group consisting of hydrogen bromide (HBr), boron trichloride (BCl$_3$), and mixtures thereof to produce a semiconductor device.

23. The method of claim 22 wherein said etchant gas of step (b) consists essentially of the halogen gas, carbon monoxide (CO), and nitrogen (N$_2$).

24. The method of claim 22 wherein said etchant gas of step (b) comprises from about 10% by vol. to about 99% by vol. of the halogen gas, and from about 1% by vol. to about 90% by vol. carbon monoxide (CO), and from about 10% by vol. to about 99% by vol. nitrogen (N$_2$).

25. The method of claim 24 wherein said etchant gas of step (b) consists essentially of from about 10% by vol. to about 99% by vol. of the halogen gas, and from about 1% by vol. to about 90% by vol. carbon monoxide (CO), and from about 10% by vol. to about 99% by vol. nitrogen (N$_2$).

26. The method of claim 22 wherein said etchant gas of step (c) comprises from about 10% by vol. to about 99% by vol. of the halogen gas; from about 1% by vol. to about 90% by vol. carbon monoxide (CO); and from about 10% by vol. to about 99% by vol. of the gas selected from the group consisting of hydrogen bromide (HBr), boron trichloride (BCl$_3$), and mixtures thereof.

27. The method of claim 22 additionally comprising disposing, prior to said etching step (b), said substrate of step (a) in a high density plasma chamber including a coil inductor and a wafer pedestal; and performing said etching step (b) and said etching step (c) in said high density plasma chamber under the following process conditions:

| Process | Parameters |
| --- | --- |
| Carbon Monoxide (CO) | 1 to 90% by vol. |
| Halogen gas | 10 to 99% by vol. |
| Nitrogen (N$_2$) | 10 to 99% by vol. |
| Pressure, mTorr | 0.5 to 50 milliTorr |
| RF Power (watts) of Coil Inductor | 100 to 3000 watts |

-continued

| Process | Parameters |
| --- | --- |
| RF Power (watts) of Wafer Pedestal | 50 to 1500 watts |
| Temperature (° C.) of Substrate | 20 to 100° C. |
| Tungsten-Silicide Etch Rate (Å/min) | 1500 to 3000 (Å/min) |
| RF Frequency of Coil Inductor | 100 K to 200 MHz |
| RF Frequency of Wafer Pedestal. | 100 K to 200 MHz |

28. The method of claim 27 additionally comprising disposing, prior to said etching step (c), said substrate after step (b) in a high density plasma chamber including a coil inductor and a wafer pedestal; and performing said etching step (c) in said high density plasma chamber under the following process conditions:

| Process | Parameters |
| --- | --- |
| Carbon Monoxide (CO) | 1 to 90% by vol. |
| Halogen gas | 10 to 99% by vol. |
| Hydrogen Bromide (HBr) and/or Boron Trichloride (BCl$_3$) | 10 to 99% by vol. |
| Pressure, mTorr | 0.5 to 50 milliTorr |
| RF Power (watts) of Coil Inductor | 100 to 3000 watts |
| RF Power (watts) of Wafer Pedestal | 50 to 1500 watts |
| Temperature (° C.) of Substrate | 20 to 100° C. |
| Polysilicon Etch Rate (Å/min) | 200 to 4000 (Å/min) |
| RF Frequency of Coil Inductor | 100 K to 200 MHz |
| RF Frequency of Wafer Pedestal. | 100 K to 200 MHz |

29. An etchant gas comprising from about 10% by vol. to about 99% by vol. of a halogen gas; and from about 1% by vol. to about 90% by vol. carbon monoxide (CO); and from about 10% by vol. to about 99% by vol of a nitrogen-containing gas.

30. The etchant gas of claim 29 wherein said halogen gas is chlorine (Cl$_2$).

31. The etchant gas of claim 30 wherein said nitrogen-containing gas is nitrogen (N$_2$).

32. The etchant gas of claim 31 wherein said halogen gas is chlorine (Cl$_2$).

33. An etchant gas comprising from about 10% by vol. to about 99% by vol. of a halogen gas; from about 1% by vol. to about 90% by vol. carbon monoxide (CO); and from about 10% by vol. to about 99% by vol. of a gas selected from the group consisting of hydrogen bromide (HBr), boron trichloride (BCl$_3$), and mixtures thereof.

34. The etchant gas of claim 33 wherein said halogen gas is chlorine (Cl$_2$).

35. The method of claim 1 wherein said halogen gas is chlorine (Cl$_2$).

36. The method of claim 5 wherein said halogen gas is chlorine (Cl$_2$).

37. The method of claim 6 wherein said halogen gas is chlorine (Cl$_2$).

38. The method of claim 7 wherein said halogen gas is chlorine (Cl$_2$).

39. The method of claim 8 wherein said halogen gas is chlorine (Cl$_2$).

40. The method of claim 9 wherein said halogen gas is chlorine (Cl$_2$).

41. The method of claim 1 wherein said etchant gas consists essentially of the halogen gas and carbon monoxide (CO).

42. The method of claim 39 wherein said etchant gas consists essentially of from about 70% by volume to about 80% by volume of the halogen gas and from about 20% by volume to about 30% by volume of carbon monoxide (CO).

43. The method of claim 41 wherein said halogen gas is chlorine.

44. The method of claim 42 wherein said halogen gas is chlorine.

45. A method for etching at least one conductive layer on a substrate comprising the steps of:
(a) providing a substrate supporting at least one conductive layer; and
(b) etching the conductive layer with an etchant gas comprising from about 70% by volume to about 80% by volume of a halogen gas and from about 20% by volume to about 30% by volume of carbon monoxide (CO) to produce an etched conductive layer supported by said substrate.

46. The method of claim 45 wherein said etching step (b) additionally comprises etching the conductive layer in a high density plasma of the etchant gas.

47. The method of claim 45 wherein said providing step (a) additionally includes providing a gate oxide layer disposed on said substrate between said substrate and said at least one conductive layer, and said etching step (b) forms essentially no microtrenches in said gate oxide layer.

48. The method of claim 47 wherein said conductive layer comprises a polysilicon layer, and a tungsten silicide layer supported by said polysilicon layer.

49. The method of claim 47 wherein said etchant gas consists essentially of from about 70% by volume to about 80% by volume of the halogen gas and from about 20% by volume to about 30% by volume of said carbon monoxide (CO).

50. A method for etching at least one conductive layer on a substrate comprising the steps of:
(a) providing a substrate supporting at least one conductive layer; and
(b) etching the conductive layer with an etchant gas comprising a halogen gas, carbon monoxide (CO), and He:O$_2$ to produce an etched conductive layer supported by said substrate.

51. The method of claim 50 wherein said etchant gas comprises from about 10% by volume to about 90% by volume of the halogen gas, from about 5% by volume to about 80% by volume of carbon monoxide (CO), and from about 5% by volume to about 10% by volume He:O$_2$.

52. The method of claim 50 wherein said etchant gas consists essentially of from about 10% by volume to about 90% by volume of the halogen gas, from about 5% by volume to about 80% by volume of carbon monoxide (CO), and from about 5% by volume to about 10% by volume He:O$_2$.

53. The method of claim 12 wherein said halogen gas is chlorine (Cl$_2$).

54. The method of claim 16 wherein said halogen gas is chlorine (Cl$_2$).

55. The method of claim 19 wherein said halogen gas is chlorine (Cl$_2$).

56. The method of claim 12 wherein said etching step (c) additionally comprises etching said tungsten-silicide layer of step (a) in a high density plasma of said etchant gas of step (b).

57. The method of claim 12 wherein said etching step (e) additionally comprises etching said polysilicon layer of step (e) in a high density plasma of said etchant gas of step (d).

58. The method of claim 56 wherein said etching step (e) additionally comprises etching said polysilicon layer of step (e) in a high density plasma of said etchant gas of step (d).

59. The method of claim 12 wherein said substrate for said etching step (c) has a temperature ranging from 20° C. to 100° C. during said etching step (c).

60. The method of claim 12 wherein said substrate for said etching step (e) has a temperature ranging from 20° C. to 100° C. during said etching step (e).

61. The method of claim 22 wherein said halogen gas is chlorine ($Cl_2$).

62. The method of claim 23 wherein said halogen gas is chlorine ($Cl_2$).

63. The method of claim 24 wherein said halogen gas is chlorine ($Cl_2$).

64. The method of claim 25 wherein said halogen gas is chlorine ($Cl_2$).

65. The method of claim 22 wherein said etching step (b) additionally comprises etching said portion of the tungsten-silicide layer of step (a) in a high density plasma of said etchant gas of step (b).

66. The method of claim 22 wherein said etching step (c) additionally comprises etching said polysilicon layer in a high density plasma of said etchant gas of step (c).

67. The method of claim 63 wherein said etching step (c) additionally comprises etching said polysilicon layer in a high density plasma of said etchant gas of step (c).

68. The method of claim 22 wherein said silicon substrate for said etching step (b) has a temperature ranging from 20° C. to 100° C. during said etching step (b).

69. The method of claim 22 wherein said silicon substrate for said etching step (c) has a temperature ranging from 20° C. to 100° C. during said etching step (c).

70. The etchant gas of claim 29 wherein said etchant gas consists essentially of from about 10% by vol. to about 99% by vol. of the halogen gas, and from about 1% by vol. to about 90% by vol. carbon monoxide (CO), and from about 10% by vol. to about 99% by vol. of the nitrogen-containing gas.

71. The etchant gas of claim 29 wherein said etchant gas consists essentially of from about 40% by vol. to about 80% by vol. of the halogen gas, and from about 20% by vol. to about 30% by vol. carbon monoxide (CO), and from about 20% by vol. to about 30% by vol. of the nitrogen-containing gas.

72. The etchant gas of claim 33 wherein said etchant gas consists essentially of from about 10% by vol. to about 99% by vol. of the halogen gas; from about 1% by vol. to about 90% by vol. carbon monoxide (CO); and from about 10% by vol. to about 99% by vol. of a gas selected from the group consisting of hydrogen bromide (HBr), boron trichloride ($BCl_3$) and mixtures thereof.

73. The etchant gas of claim 33 wherein said etchant gas consists essentially of from about 40% by vol. to about 80% by vol. from about 20% by vol. to about 30% by vol. carbon monoxide (CO); and from about 40% by vol. to about 80% by vol. of a gas selected from the group consisting of hydrogen bromide (HBr), boron trichloride ($BCl_3$) and mixtures thereof.

74. An etchant gas comprising from about 10% by volume to about 90% by volume of a halogen gas; from about 5% by volume to about 80% by volume of carbon monoxide (CO); and from about 5% by volume to about 10% by volume of $He:O_2$.

75. The etchant gas of claim 74 wherein said etchant gas consists essentially from about 10% by volume to about 90% by volume of a halogen gas; from about 5% by volume to about 80% by volume of carbon monoxide (CO); and from about 5% by volume to about 10% by volume of $He:O_2$.

76. The method of claim 1 wherein said etchant gas does not comprise oxygen.

77. The method of claim 12 wherein said etchant gas of step (b) does not comprise oxygen and said etchant gas of step (d) does not comprise oxygen.

78. The method of claim 22 wherein said etchant gas of step (b) does not comprise oxygen and said etchant gas of step (c) does not comprise oxygen.

79. The etchant gas of claim 30 wherein said etchant gas does not comprise oxygen.

80. The etchant gas of claim 34 wherein said etchant gas does not comprise oxygen.

81. The method of claim 51 wherein said etchant gas does not comprise oxygen.

82. The method of claim 1 wherein said high density plasma of said etchant gas has an ion density greater than about $10^9/cm^3$.

83. The method of claim 5 wherein said high density plasma of said etchant gas for etching said tungsten silicide has an ion density greater than about $10^9/cm^3$, and said high density plasma of said etchant gas for etching said polysilicon layer has an ion density greater than about $10^9/cm^3$.

84. The method of claim 6 wherein said high density plasma of said etchant gas for etching said tungsten silicide has an ion density greater than about $10^9/cm^3$, and said high density plasma of said etchant gas for etching said polysilicon layer has an ion density greater than about $10^9/cm^3$.

85. The method of claim 46 wherein said high density plasma of said etchant gas has an ion density greater than about $10^9/cm^3$.

86. The method of claim 56 wherein said high density plasma of said etchant gas of step (b) has an ion density greater than about $10^9/cm^3$.

87. The method of claim 57 wherein said high density plasma of said etchant gas of step (d) has an ion density greater than about $10^9/cm^3$.

88. The method of claim 58 wherein said high density plasma of said etchant gas of step (d) has an ion density greater than about $10^9/cm^3$.

89. The method of claim 65 wherein said high density plasma of said etchant gas of step (b) has an ion density greater than about $10^9/cm^3$.

90. The method of claim 66 wherein said high density plasma of said etchant gas of step (c) has an ion density greater than about $10^9/cm^3$.

91. The method of claim 67 wherein said high density plasma of said etchant gas of step (c) has an ion density greater than about $10^9/cm^3$.

* * * * *